(12) United States Patent
Tzannes

(10) Patent No.: US 10,833,809 B2
(45) Date of Patent: *Nov. 10, 2020

(54) TECHNIQUES FOR PACKET AND MESSAGE COMMUNICATION IN A MULTICARRIER TRANSCEIVER ENVIRONMENT

(71) Applicant: TQ DELTA, LLC, Austin, TX (US)

(72) Inventor: Marcos C. Tzannes, Petaluma, CA (US)

(73) Assignee: TQ DELTA, LLC, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/701,343

(22) Filed: Dec. 3, 2019

(65) Prior Publication Data

US 2020/0106558 A1 Apr. 2, 2020

Related U.S. Application Data

(60) Continuation of application No. 15/678,870, filed on Aug. 16, 2017, now Pat. No. 10,498,495, which is a
(Continued)

(51) Int. Cl.
*H04L 1/18* (2006.01)
*H03M 13/09* (2006.01)
(Continued)

(52) U.S. Cl.
CPC .............. *H04L 1/18* (2013.01); *H03M 13/00* (2013.01); *H03M 13/09* (2013.01);
(Continued)

(58) Field of Classification Search
None
See application file for complete search history.

(56) References Cited

U.S. PATENT DOCUMENTS 4,439,859 A 3/1984 Donnan
4,564,900 A 1/1986 Smitt
(Continued)

FOREIGN PATENT DOCUMENTS

CN 1350297 A 5/2002
CN 1352862 A 6/2002
(Continued)

OTHER PUBLICATIONS

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents made publicly available on Jun. 15, 2020; Docket Nos. 1305; 1307; 1309; and 1312 (628 pages).

(Continued)

*Primary Examiner* — Justin R Knapp
(74) *Attorney, Agent, or Firm* — Jason H. Vick; Sheridan Ross, PC

(57) ABSTRACT

Through the identification of different packet-types, packets can be handled based on an assigned packet handling identifier. This identifier can, for example, enable forwarding of latency-sensitive packets without delay and allow error-sensitive packets to be stored for possible retransmission. In another embodiment, and optionally in conjunction with retransmission protocols including a packet handling identifier, a memory used for retransmission of packets can be shared with other transceiver functionality such as, coding, decoding, interleaving, deinterleaving, error correction, and the like.

28 Claims, 4 Drawing Sheets

Related U.S. Application Data continuation of application No. 14/742,334, filed on Jun. 17, 2015, now Pat. No. 9,749,235, which is a continuation of application No. 14/075,194, filed on Nov. 8, 2013, now Pat. No. 9,094,348, which is a continuation of application No. 12/760,728, filed on Apr. 15, 2010, now Pat. No. 8,595,577, which is a division of application No. 12/295,828, filed as application No. PCT/US2007/066522 on Apr. 12, 2007, now Pat. No. 8,335,956.

(60) Provisional application No. 60/849,650, filed on Oct. 5, 2006, provisional application No. 60/792,236, filed on Apr. 12, 2006.

(51) Int. Cl.

| | |
|---|---|
| H03M 13/00 | (2006.01) |
| H03M 13/27 | (2006.01) |
| H04L 1/00 | (2006.01) |
| H04L 12/54 | (2013.01) |
| H04L 12/801 | (2013.01) |
| H04L 12/851 | (2013.01) |
| H04L 12/823 | (2013.01) |
| H04L 12/721 | (2013.01) |
| H04L 29/08 | (2006.01) |
| H04L 12/701 | (2013.01) |
| H04L 1/08 | (2006.01) |
| H04L 1/16 | (2006.01) |
| H04L 12/939 | (2013.01) |
| H04L 12/70 | (2013.01) |

(52) U.S. Cl.
CPC ..... *H03M 13/091* (2013.01); *H03M 13/2707* (2013.01); *H03M 13/6513* (2013.01); *H04L 1/0041* (2013.01); *H04L 1/0045* (2013.01); *H04L 1/0057* (2013.01); *H04L 1/08* (2013.01); *H04L 1/1607* (2013.01); *H04L 1/1809* (2013.01); *H04L 1/1835* (2013.01); *H04L 1/1874* (2013.01); *H04L 12/5601* (2013.01); *H04L 45/00* (2013.01); *H04L 45/72* (2013.01); *H04L 47/10* (2013.01); *H04L 47/2433* (2013.01); *H04L 47/2441* (2013.01); *H04L 47/32* (2013.01); *H04L 49/552* (2013.01); *H04L 69/324* (2013.01); *H04L 2012/5647* (2013.01)

(56) References Cited

U.S. PATENT DOCUMENTS

| | | |
|---|---|---|
| 4,914,653 A | 4/1990 | Bishop et al. |
| 4,979,174 A | 12/1990 | Cheng et al. |
| 5,063,533 A | 11/1991 | Erhart et al. |
| 5,214,501 A | 5/1993 | Cavallerano et al. |
| 5,287,384 A | 2/1994 | Avery et al. |
| 5,319,648 A | 6/1994 | Bux et al. |
| 5,351,016 A | 9/1994 | Dent |
| 5,420,640 A | 5/1995 | Munich et al. |
| 5,422,913 A | 6/1995 | Wilkinson |
| 5,524,116 A | 6/1996 | Kalmanek, Jr. et al. |
| 5,563,915 A | 10/1996 | Stewart |
| 5,596,604 A | 1/1997 | Cioffi et al. |
| 5,635,864 A | 6/1997 | Jones |
| 5,663,910 A | 9/1997 | Ko et al. |
| 5,675,585 A | 10/1997 | Bonnot et al. |
| 5,726,644 A | 3/1998 | Jednacz et al. |
| 5,737,337 A | 4/1998 | Voith et al. |
| 5,745,275 A | 4/1998 | Giles et al. |
| 5,751,338 A | 5/1998 | Ludwig, Jr. |
| 5,751,741 A | 5/1998 | Voith et al. |
| 5,757,416 A | 5/1998 | Birch et al. |
| 5,764,649 A | 6/1998 | Tong |
| 5,764,693 A | 6/1998 | Taylor et al. |
| 5,793,759 A | 8/1998 | Rakib et al. |
| 5,835,527 A | 11/1998 | Lomp |
| 5,867,400 A | 2/1999 | El-Ghoroury et al. |
| 5,898,698 A | 4/1999 | Bross |
| 5,903,612 A | 5/1999 | Van Der Putten et al. |
| 5,905,874 A | 5/1999 | Johnson |
| 5,912,898 A | 6/1999 | Khoury |
| 5,917,340 A | 6/1999 | Manohar et al. |
| 5,968,200 A | 10/1999 | Amrany |
| 5,983,382 A | 11/1999 | Pauls |
| 5,991,857 A | 11/1999 | Koetje et al. |
| 5,995,539 A | 11/1999 | Miller |
| 6,005,851 A | 12/1999 | Craddock et al. |
| 6,041,057 A | 3/2000 | Stone |
| 6,081,291 A | 6/2000 | Ludwig, Jr. |
| 6,098,188 A | 8/2000 | Kalmanek, Jr. et al. |
| 6,151,690 A | 11/2000 | Peeters |
| 6,212,166 B1 | 4/2001 | Akiyama et al. |
| 6,226,322 B1 | 5/2001 | Mukherjee |
| 6,266,337 B1 | 6/2001 | Marco |
| 6,285,665 B1 | 9/2001 | Chuah |
| 6,308,278 B1 | 10/2001 | Khouli et al. |
| 6,337,877 B1 | 1/2002 | Cole et al. |
| 6,381,728 B1 | 4/2002 | Kang |
| 6,392,572 B1 | 5/2002 | Shiu et al. |
| 6,421,323 B1 | 7/2002 | Nelson et al. |
| 6,473,418 B1 | 10/2002 | Laroia et al. |
| 6,480,976 B1 | 11/2002 | Pan et al. |
| 6,484,283 B2 | 11/2002 | Stephen et al. |
| 6,496,481 B1 | 12/2002 | Wu et al. |
| 6,498,806 B1 | 12/2002 | Davis |
| 6,519,731 B1 | 2/2003 | Huang et al. |
| 6,542,500 B1 | 4/2003 | Gerszberg et al. |
| 6,553,534 B2 | 4/2003 | Young, III et al. |
| 6,578,162 B1 | 6/2003 | Yung |
| 6,640,239 B1 | 10/2003 | Gidwani |
| 6,657,949 B1 | 12/2003 | Jones, IV et al. |
| 6,704,848 B2 | 3/2004 | Song |
| 6,707,822 B1 | 3/2004 | Fadavi-Ardekani et al. |
| 6,738,370 B2 | 5/2004 | Ostman |
| 6,754,188 B1 | 6/2004 | Garahi et al. |
| 6,754,290 B1 | 6/2004 | Halter |
| 6,765,957 B2 | 7/2004 | Palm |
| 6,775,320 B1 | 8/2004 | Tzannes et al. |
| 6,778,589 B1 | 8/2004 | Ishii |
| 6,778,596 B1 | 8/2004 | Tzannes |
| 6,801,570 B2 | 10/2004 | Yong |
| 6,826,589 B2 | 11/2004 | Berrada |
| 6,865,232 B1 * | 3/2005 | Isaksson ............... H04L 1/0025 375/260 |
| 6,865,233 B1 | 3/2005 | Eriksson et al. |
| 6,885,696 B2 | 4/2005 | Wingrove |
| 6,904,537 B1 | 6/2005 | Gorman |
| 6,922,444 B1 | 7/2005 | Cai et al. |
| 6,956,872 B1 | 10/2005 | Djokovic et al. |
| 6,988,234 B2 | 1/2006 | Han |
| 7,024,592 B1 | 4/2006 | Voas et al. |
| 7,027,782 B2 | 4/2006 | Moon et al. |
| 7,031,259 B1 | 4/2006 | Guttman et al. |
| 7,042,891 B2 | 5/2006 | Oberman et al. |
| 7,050,552 B2 | 5/2006 | Comisky |
| 7,058,085 B2 | 6/2006 | Earnshaw et al. |
| 7,103,096 B2 | 9/2006 | Mitlin et al. |
| 7,164,654 B2 | 1/2007 | Hunzinger et al. |
| 7,174,493 B2 | 2/2007 | Matsumoto et al. |
| 7,187,708 B1 | 3/2007 | Shiu et al. |
| 7,200,138 B2 | 4/2007 | Liu |
| 7,200,169 B2 | 4/2007 | Suzuki et al. |
| 7,200,792 B2 | 4/2007 | Kim et al. |
| 7,203,206 B2 | 4/2007 | Amidan et al. |
| 7,224,702 B2 | 5/2007 | Lee |
| 7,266,132 B1 | 9/2007 | Liu et al. |
| 7,269,208 B2 | 9/2007 | Mazzoni et al. |
| 7,272,768 B2 | 9/2007 | Chang et al. |
| 7,302,379 B2 | 11/2007 | Cioffi et al. |
| 7,400,688 B2 | 7/2008 | Garrett |

(56) References Cited

U.S. PATENT DOCUMENTS

| | | | |
|---|---|---|---|
| 7,483,421 B2 | 1/2009 | Compton | |
| 7,519,124 B2 | 4/2009 | Oksman et al. | |
| 7,600,172 B2 | 10/2009 | Berens et al. | |
| 7,657,818 B2 | 2/2010 | Cioffi et al. | |
| 7,668,101 B1 | 2/2010 | Raissinia et al. | |
| 7,729,384 B1 * | 6/2010 | Mantri | H04L 1/0041 370/476 |
| 7,764,595 B2 | 7/2010 | Treigherman | |
| 7,782,758 B2 | 8/2010 | Wydrowski et al. | |
| 7,826,438 B1 | 11/2010 | Salhotra et al. | |
| 7,831,890 B2 | 11/2010 | Tzannes et al. | |
| 7,836,381 B1 | 11/2010 | Tzannes et al. | |
| 7,844,882 B2 | 11/2010 | Tzannes et al. | |
| 7,856,033 B2 | 12/2010 | Oksman et al. | |
| 7,933,295 B2 | 4/2011 | Thi et al. | |
| 8,031,760 B2 | 10/2011 | Peeters et al. | |
| 8,074,138 B2 | 12/2011 | Chae et al. | |
| 8,098,613 B2 | 1/2012 | Bi et al. | |
| 8,149,904 B2 | 4/2012 | Efland et al. | |
| 8,276,048 B2 | 9/2012 | Tzannes et al. | |
| 8,335,956 B2 | 12/2012 | Tzannes | |
| 8,407,546 B2 | 3/2013 | Tzannes | |
| 8,468,411 B2 | 6/2013 | Tzannes | |
| 8,495,473 B2 | 7/2013 | Tzannes et al. | |
| 8,595,577 B2 | 11/2013 | Tzannes | |
| 8,607,126 B1 | 12/2013 | Tzannes et al. | |
| 8,645,784 B2 | 2/2014 | Tzannes | |
| 8,775,890 B2 | 7/2014 | Yap et al. | |
| 9,069,718 B2 | 6/2015 | Tzannes et al. | |
| 9,094,348 B2 * | 7/2015 | Tzannes | H04L 45/00 |
| 9,286,251 B2 | 3/2016 | Tzannes et al. | |
| 9,485,055 B2 | 11/2016 | Tzannes | |
| 9,547,608 B2 | 1/2017 | Tzannes et al. | |
| 9,749,235 B2 * | 8/2017 | Tzannes | H04L 45/72 |
| 9,898,220 B2 | 2/2018 | Tzannes et al. | |
| 10,044,473 B2 | 8/2018 | Tzannes | |
| 10,409,510 B2 | 9/2019 | Tzannes et al. | |
| 10,484,140 B2 | 11/2019 | Tzannes | |
| 10,498,495 B2 | 12/2019 | Tzannes | |
| 10,579,291 B2 | 3/2020 | Tzannes et al. | |
| 2001/0014962 A1 | 8/2001 | Obuchi et al. | |
| 2001/0031011 A1 | 10/2001 | Betts | |
| 2001/0039637 A1 | 11/2001 | Bengough | |
| 2002/0015401 A1 | 2/2002 | Subramanian et al. | |
| 2002/0048365 A1 | 4/2002 | Namiki et al. | |
| 2002/0087710 A1 | 7/2002 | Aiken et al. | |
| 2002/0126675 A1 | 9/2002 | Yoshimura et al. | |
| 2002/0154600 A1 | 10/2002 | Ido et al. | |
| 2003/0005387 A1 | 1/2003 | Tsunoda | |
| 2003/0008821 A1 | 1/2003 | Detmar et al. | |
| 2003/0009717 A1 | 1/2003 | Fukushima et al. | |
| 2003/0014709 A1 | 1/2003 | Miyoshi et al. | |
| 2003/0053435 A1 | 3/2003 | Sindhushayana et al. | |
| 2003/0067877 A1 | 4/2003 | Sivakumar et al. | |
| 2003/0076870 A1 | 4/2003 | Moon et al. | |
| 2003/0088821 A1 | 5/2003 | Yokokawa et al. | |
| 2003/0093750 A1 | 5/2003 | Cameron | |
| 2003/0097629 A1 | 5/2003 | Moon et al. | |
| 2003/0118031 A1 | 6/2003 | Classon et al. | |
| 2003/0131209 A1 | 7/2003 | Lee | |
| 2003/0179770 A1 | 9/2003 | Reznic et al. | |
| 2004/0013195 A1 | 1/2004 | Panusopone et al. | |
| 2004/0109455 A1 | 6/2004 | Jouppi et al. | |
| 2004/0114536 A1 | 6/2004 | O'Rourke | |
| 2004/0120435 A1 | 6/2004 | Yang et al. | |
| 2004/0148552 A1 | 7/2004 | Matsumoto et al. | |
| 2004/0174938 A1 | 9/2004 | Kim | |
| 2004/0179494 A1 | 9/2004 | Attar et al. | |
| 2004/0196786 A1 | 10/2004 | Laha et al. | |
| 2004/0203455 A1 | 10/2004 | Bao et al. | |
| 2004/0203723 A1 | 10/2004 | Han | |
| 2005/0034046 A1 | 2/2005 | Berkmann et al. | |
| 2005/0036497 A1 | 2/2005 | Kawakami | |
| 2005/0068916 A1 | 3/2005 | Jacobsen et al. | |
| 2005/0079889 A1 | 4/2005 | Vaglica et al. | |
| 2005/0180323 A1 | 8/2005 | Beightol et al. | |
| 2005/0204251 A1 | 9/2005 | Moon et al. | |
| 2005/0216812 A1 | 9/2005 | Leon et al. | |
| 2005/0254441 A1 | 11/2005 | Levi et al. | |
| 2005/0254508 A1 | 11/2005 | Aksu et al. | |
| 2006/0089833 A1 | 4/2006 | Su et al. | |
| 2006/0092871 A1 | 5/2006 | Nishibayashi et al. | |
| 2006/0098662 A1 | 5/2006 | Gupta et al. | |
| 2006/0112168 A1 | 5/2006 | Albers et al. | |
| 2006/0236045 A1 | 10/2006 | Keyes, Jr. | |
| 2006/0242153 A1 | 10/2006 | Newberry et al. | |
| 2006/0259846 A1 | 11/2006 | Bhushan | |
| 2007/0198898 A1 | 8/2007 | Ysebaert et al. | |
| 2007/0206621 A1 | 9/2007 | Plamondon et al. | |
| 2007/0263528 A1 | 11/2007 | Mukherjee | |
| 2008/0077837 A1 | 3/2008 | Lohr et al. | |
| 2008/0175186 A1 | 7/2008 | Liu et al. | |
| 2008/0212582 A1 | 9/2008 | Zwart et al. | |
| 2009/0013232 A1 | 1/2009 | Wan et al. | |
| 2009/0217120 A1 | 8/2009 | Sawahashi et al. | |
| 2009/0300468 A1 | 12/2009 | Pekonen | |
| 2009/0319854 A1 | 12/2009 | Qian et al. | |
| 2009/0327829 A1 | 12/2009 | Yang et al. | |
| 2010/0061376 A1 | 3/2010 | Shimizu | |
| 2011/0142025 A1 * | 6/2011 | Agee | H04B 7/0413 370/342 |
| 2019/0369891 A1 | 12/2019 | Tzannes et al. | |
| 2019/0393991 A1 | 12/2019 | Tzannes | |

FOREIGN PATENT DOCUMENTS

| | | |
|---|---|---|
| CN | 1527487 A | 9/2004 |
| EP | 0833474 A2 | 4/1998 |
| EP | 1006689 | 6/2000 |
| EP | 1041756 | 10/2000 |
| EP | 1225735 | 7/2002 |
| EP | 1246409 | 10/2002 |
| EP | 1271833 | 1/2003 |
| EP | 1361690 | 11/2003 |
| EP | 1385292 | 1/2004 |
| EP | 1507353 | 2/2005 |
| EP | 1367809 | 1/2006 |
| GB | 2389493 | 12/2003 |
| JP | 06-164648 | 6/1994 |
| JP | 07-254862 | 10/1995 |
| JP | Hei09-247048 | 9/1997 |
| JP | Hei11-150764 | 6/1999 |
| JP | Hei11-355254 A | 12/1999 |
| JP | 2000-341247 | 12/2000 |
| JP | 2001-119437 | 4/2001 |
| JP | 2002-084338 | 3/2002 |
| JP | 2002-118527 | 4/2002 |
| JP | 2003-008553 | 1/2003 |
| JP | 2003-509966 | 3/2003 |
| JP | 2003-224615 | 8/2003 |
| JP | 2004-007269 | 1/2004 |
| JP | 2004-007823 | 1/2004 |
| JP | 2004-030506 | 1/2004 |
| JP | 2004-056221 | 2/2004 |
| JP | 2004-135013 | 4/2004 |
| JP | 2005-064594 | 3/2005 |
| JP | 2005-191735 | 7/2005 |
| JP | 2005-522963 | 7/2005 |
| JP | 2005-526422 | 9/2005 |
| KR | 2000-0016939 | 3/2000 |
| KR | 10-2000-0047827 | 7/2000 |
| KR | 10-0295086 B1 | 4/2001 |
| KR | 2001-0077300 | 8/2001 |
| KR | 10-2004-0009928 | 1/2004 |
| KR | 10-2004-0014977 | 2/2004 |
| WO | WO 98/47238 | 10/1998 |
| WO | WO 00/41395 | 7/2000 |
| WO | WO 00/42789 | 7/2000 |
| WO | WO 00/52834 | 9/2000 |
| WO | WO 01/11833 | 2/2001 |
| WO | WO 01/20865 | 3/2001 |
| WO | WO 03/003747 | 1/2003 |
| WO | WO 03/028296 | 4/2003 |

(56) References Cited

FOREIGN PATENT DOCUMENTS

| WO | WO 03/063060 | 7/2003 |
|---|---|---|
| WO | WO 03/090011 | 10/2003 |
| WO | WO 2006/044227 | 4/2006 |

OTHER PUBLICATIONS

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Jun. 1, 2020-Jul. 13, 2020; Docket Nos. 1322-1324; (6 pages).

Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from May 26, 2020-Jul. 23, 2020; Docket Nos. 1083-1178 (1,901 pages).

Documents filed with District Court Proceedings for *Adtran Inc. v. TQ Delta, LLC*; U.S. District Court, for the District of Delaware (Wilmington); Civil Action No. 1:15-cv-00121-RGA; Includes documents filed from May 26, 2020-Jul. 23, 2020; Docket Nos. 1079-1173 (1,885 pages).

Office Action for U.S. Appl. No. 16/544,003, dated Apr. 29, 2020.

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Feb. 18, 2020-May 22, 2020; Docket Nos. 1296-1321; (103 pages).

Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Feb. 18, 2020-Feb. 19, 2020; Docket Nos. 948-951 (7 pages).

Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Feb. 25, 2020-May 22, 2020; Docket Nos. 952-1082 (4256 pages).

Documents filed with District Court Proceedings for *Adtran Inc. v. TQ Delta, LLC*; U.S. District Court, for the District of Delaware (Wilmington); Civil Action No. 1:15-cv-00121-RGA; Includes documents filed from Feb. 18, 2020-Feb. 19, 2020; Docket Nos. 944-947 (7 pages).

Documents filed with District Court Proceedings for *Adtran Inc. v. TQ Delta, LLC*; U.S. District Court, for the District of Delaware (Wilmington); Civil Action No. 1:15-cv-00121-RGA, Includes documents filed from Feb. 25, 2020-May 22, 2020; Docket Nos. 948-1078 (4,256 pages).

U.S. Appl. No. 60/078,549, filed Mar. 19, 1998, Jacobsen et al.

Aramvith, Supavadee et al. "Wireless Video Transport Using Conditional Retransmission and Low-Delay Interleaving" IEEE 2001 (4 pages).

Bauer, Rainer et al, "Iterative Source/Channel-Decoding Using Reversible Variable Length Codes" Munich University of Technology, 2000 (10 pages).

Business Wire "New FatPipe T1 Speed Product Produces Speeds up to 4.5Mbps and Redundancy for a Fraction of the Cost of a Fractional T3!" Business Wire, Oct. 16, 1998 (2 pages).

Buzzard, Greg et al., "An Implementation of the Hamlyn Sender-Managed Interface Architecture" The Second Symposium on Operating Systems Design and Implementation (OSDI '96) Proceedings (Seattle, WA), Oct. 28-31, 1996 (15 pages).

Cisco Systems, Inc. "Alternatives for High Bandwidth Connections Using Parallel T1/E1 Links" 1998 (8 pages).

Eberle, Wolfgang et al. "80-Mb/S QPSK and 72-Mb/s 64-QAM Flexible and Scalable Digital OFDM Transceiver ASICs for Wireless Local Area Networks in the 5-GHz Band" IEEE Journal of Solid-State Circuits, vol. 36, No. 11, Nov. 2001 (10 pages).

Goodman, David et al. "Maximizing the Throughput to CDMA Data Communications" Polytechnic University, Brooklyn, NY, Oct. 2003 (5 pages).

"ITU-T Recommendation G.992.1, Series G: Transmission Systems and Media, Digital Systems and Networks" Jun. 1999 (256 pages).

"ITU-T Recommendation G.992.3," International Telecommunication Union, ADSL2, Jan. 2005, 436 pages.

ITU-T Recommendation G.992.3, "Asymmetric Digital Subscriber Line Transceivers 2 (ADSL2)" International Telecommunication Union, Apr. 2009, 404 pages.

ITU-T Recommendation G.992.3 Annex C, "Annex C: Specific Requirements for an ADSL System Operating in the Same Cable as ISDN as Defined in Appendix III of Recommendation ITU-T G.961" International Telecommunication Union, Apr. 2009, 296 pages.

"ITU-T Recommendation G.992.5—Series G: Transmission Systems and Media, Digital Systems and Networks", International Telecommunication Union, ADSL2, May 2003, 92 pages.

ITU-T Recommendation G.993.1 "Very High Speed Digital Subscriber Line Transceivers" Jun. 2004 (228 pages).

ITU-Telecommunication Standardization Sector; Study Group 15; Alcatel; "G.gen: A Hybrid PCTCM-ARQ Error Correction Scheme" Temporary Document HC-52; Huntsville, Canada; Aug. 2000 (6 pages).

ITU-T SG15/Q4 Contribution LB-031 "VDSL2—Constraining the Interleaver Complexity" Texas Instruments, Inc, Jun. 2004 (7 pages).

Johns, David A., et al. "Integrated Circuits for Data Transmission Over Twisted-Pair Channels" IEEE Journal of Solid-State Circuits, vol. 32, Nov. 3, Mar. 1997 (9 pages).

Petzold, Mark C. et al. "Multicarrier Spread Spectrum Performance in Fading Channels with Serial Concatenated Convolutional Coding" IEEE 1998 (4 pages).

Shoji, T. et al: "Wireless Access Method to Ensure Each Users QOS in Unpredictable and Various QOS Requirements Wireless Personal Communications," Springer, Dordrecht, NL, vol. 22, No. 2, Aug. 2002, pp. 139-151.

Sklower, K. et al. "The PPP Multilink Protocol (MP)" Network Working Group, Nov. 1994 (15 pages).

"Sunset xDSL: Prequalification of ADSL Circuits with ATU-C Emulation," Sunrise Telecom Inc., Application Series, 2001, San Jose, USA, p. 3, available at http://www.sunrisetelecom.com/technotes/APP-xDSL-8B.pdf.

"VDSL2 ITU-T Recommendation G.993.2," International Telecommunication Union, Feb. 2006, 252 pages.

Wolman, Alec et al. "Latency Analysis of TCP on an ATM Network" University of Washington, Printed Sep. 19, 2014 (14 pages).

Yamada, Hitoshi et al. "QoS Control by Traffic Engineering in Content Delivery Networks" Fujitsu Science and Technology Journal, Dec. 2003 (11 pages).

International Search Report for International (PCT) Patent Application No. PCT/US2005/036015, dated Feb. 8, 2006.

Written Opinion for International (PCT) Patent Application No. PCT/US2005/036015, dated Feb. 8, 2006.

International Preliminary Report on Patentability for International (PCT) Patent Application No. PCT/US2005/036015, dated Apr. 26, 2007.

Examiner's First Report for Australian Patent Application No. 2005296086, dated Jun. 24, 2009.

Examiner's First Report for Australian Patent Application No. 2011201250 dated May 13, 2013.

Notice of Acceptance for Australian Patent Application No. 2015200618 dated Jul. 15, 2015.

Examiner's Report for Canadian Patent Application No. 2,580,280, dated Sep. 14, 2012.

Notice of Allowance for Canadian Patent Application No. 2,580,280, dated Aug. 5, 2013.

Examiner's Report for Canadian Patent Application No. 2,869,452, dated Dec. 15, 2014.

Notice of Allowance for Canadian Patent Application No. 2,869,452, dated Apr. 20, 2015.

Examiner's Report for Canadian Patent Application No. 2,909,150, dated Aug. 10, 2016.

(56) References Cited

OTHER PUBLICATIONS

Notice of Allowance for Canadian Patent Application No. 2,909,150, dated Mar. 28, 2017.
Examiner's Report for Canadian Patent Application No. 2,980,607 dated Aug. 10, 2018.
Notice of Allowance for Canadian Patent Application No. 2,980,607 dated Sep. 30, 2019.
Notification of the First Office Action (including translation) for Chinese Patent Application No. 200580032703, dated Sep. 25, 2009.
Official Action (including translation) for Chinese Patent Application No. 200580032703, dispatched May 18, 2011.
Official Action (including translation) for Chinese Patent Application No. 200580032703.1, dispatched Mar. 28, 2012.
Decision of Refusal (including translation) for Chinese Patent Application No. 200580032703.1, dispatched Sep. 5, 2012.
Notification of Reexamination (including translation) for Chinese Patent Application No. 200580032703.1, dispatched Oct. 29, 2014.
Reexamination Decision (including translation) for Chinese Patent Application No. 200580032703.1, dispatched Apr. 14, 2015.
First Office Action (including translation) for Chinese Patent Application No. 201510413116.2, dispatched Sep. 30, 2017.
Second Office Action (including translation) for Chinese Patent Application No. 201510413116.2, dated Aug. 1, 2018.
Third Office Action (including translation) for Chinese Patent Application No. 201510413116.2, dated Mar. 22, 2019.
Notification to Grant Patent Right for Invention (including translation) for Chinese Patent Application No. 201510413116.2, dated Sep. 19, 2019.
Official Action for European Application No. 05807443.6, dated Mar. 6, 2013.
Official Action for European Application No. 05807443.6, dated Dec. 8, 2015.
Intent to Grant for European Application No. 05807443.6, dated Sep. 22, 2017.
European Search Report for European Application No. 18153945.3, dated May 3, 2018.
First Examination Report for Indian Patent Application No. 1208/KOLNP/2007, dated Mar. 18, 2013.
Official Action (translation only) for Korean Patent Application No. 10-2007-7008270, dated Jun. 30, 2011.
Notice of Allowance (including translation) for Korean Patent Application No. 10-2007-7008270, dated Mar. 29, 2012.
Official Action (translation only) for Korean Patent Application No. 10-2010-7022463, dated Jun. 30, 2011.
Notice of Allowance (including translation) for Korean Patent Application No. 10-2010-7022463, dated Mar. 29, 2012.
Official Action (including translation) for Japanese Patent Application No. 2007-535818, dispatched Jul. 11, 2011.
Notice of Allowance (Including Translation) for Japanese Patent Application No. 2007-535818, dispatched Dec. 12, 2011.
Official Action (including translation) for Japanese Patent Application No. 2008-264540, dispatched Jul. 11, 2011.
Official Action (including translation) for Japanese Patent Application No. 2008-264540, dispatched Dec. 12, 2011.
Notice of Allowance for Japanese Patent Application No. 2008-264540, dated Mar. 26, 2012.
Invitation to Pay Additional Fees (including partial international search report) for International (PCT) Patent Application No. PCT/US2007/066522, dated Feb. 6, 2008.
International Search Report for International (PCT) Patent Application No. PCT/US2007/066522, dated Apr. 14, 2008.
Written Opinion for International (PCT) Patent Application No. PCT/US2007/066522, dated Apr. 14, 2008.
International Preliminary Report on Patentability for International (PCT) Patent Application No. PCT/US2007/066522, dated Oct. 23, 2008.
Examiner's First Report on Australian Patent Application No. 2007257055, dated Mar. 30, 2010.

Office Action for Brazilian Patent Application No. PI0709871-5, dated Apr. 26, 2019.
Notice of Grant for Brazilian Patent Application No. PI0709871-5, dated Sep. 12, 2019.
Examiner's Report for Canadian Patent Application No. 2,647,589, dated Dec. 16, 2013.
Examiner's Report for Canadian Patent Application No. 2,647,589, dated Feb. 26, 2015.
Examiner's Report for Canadian Patent Application No. 2,647,589, dated Feb. 25, 2016.
Examiner's Report for Canadian Patent Application No. 2,647,589, dated Feb. 10, 2017.
Notice of Allowance for Canadian Patent Application No. 2,647,589, dated Jan. 12, 2018.
Examiner's Report for Canadian Patent Application No. 3,011,163, dated Apr. 6, 2019.
Official Action (including translation) for Chinese Patent Application No. 200780012891.0, dispatched Mar. 16, 2011.
Notification of the Second Office Action (including translation) for Chinese Patent Application No. 200780012891.0, dispatched Mar. 7, 2012.
Notification of the Second Office Action (including translation) for Chinese Patent Application No. 200780012891.0, dispatched Dec. 12, 2012.
Official Action for Columbian Patent Application No. 08-109-377, dated Nov. 5, 2010.
Examination Report for European Patent Application No. 07811844.5, dated Apr. 1, 2009.
Official Action for European Patent Application No. 07811844.5, dated Jul. 9, 2010.
Official Action for European Patent Application No. 07811844.5, dated Dec. 21, 2010.
Official Action for European Patent Application No. 07811844.5, dated Dec. 18, 2012.
Communication Under Rule 71(3) EPC—Intention to Grant for European Application No. 07811844.5, dated May 9, 2016.
European Search Report and Opinion for European Patent Application No. 10000017.3, dated Mar. 17, 2010.
Official Action for European Patent Application No. 10000017.3, dated Nov. 3, 2010.
Official Action for European Patent Application No. 10000017.3, dated Nov. 20, 2013.
Official Action for European Patent Application No. 10000017.3, dated Oct. 20, 2015.
Intention to Grant for European Patent Application No. 10000017.3, dated Sep. 16, 2016.
European Search Report and Opinion for European Patent Application No. 10000016.5, dated Mar. 3, 2010.
Official Action for European Patent Application No. 10000016.5, dated Nov. 3, 2010.
Official Action for European Patent Application No. 10000016.5, dated Dec. 22, 2011.
Communication Under Rule 71(3) EPC—Intention to Grant for European Patent Application No. 10000016.5, dated Dec. 18, 2012.
Decision to Grant a European Patent Pursuant to Article 97(1) EPC for European Patent Application No. 10000016.5, dated May 31, 2013.
European Search Report for European Patent Application No. 17020026.5 dated Apr. 25, 2017.
Intention to Grant for European Patent Application No. 17020026.5 dated Jun. 13, 2018.
European Search Report for European Patent Application No. 17020525.6 dated Feb. 22, 2018.
Office Action for European Patent Application No. 17020525.6 dated Nov. 12, 2018.
Office Action for European Patent Application No. 17020525.6 dated Apr. 5, 2019.
Office Action for European Patent Application No. 17020525.6 dated Aug. 27, 2019.
Official Action for Japanese Patent Application No. 2009-505623, dispatched Apr. 4, 2011.
Official Action (including translation) for Japanese Patent Application No. 2009-505623, dispatched Oct. 31, 2011.

(56) References Cited

OTHER PUBLICATIONS

Official Action for Japanese Patent Application No. 2010-017356, dispatched Apr. 18, 2011.
Official Action (including translation) for Japanese Patent Application No. 2010-017356, dispatched Aug. 29, 2011.
Decision of Final Rejection (Including Translation) for Japanese Patent Application No. 2010-017356, dispatched Apr. 23, 2012.
Official Action for Japanese Patent Application No. 2012-042978, dispatched Jun. 3, 2013.
Notice of Allowance for Japanese Patent Application No. 2012-042978, dispatched Feb. 17, 2014.
Official Action for Japanese Patent Application No. 2013-246257 dispatched Jan. 26, 2015.
Official Action (Including Translation) for Japanese Patent Application No. 2013-246257 dispatched Nov. 16, 2015.
Notice of Allowance (Including Translation) for Japanese Patent Application No. 2013-246257 dispatched May 30, 2016.
Official Action for Korean Patent Application No. 10-2008-7024792, dated Aug. 29, 2013.
Official Action (including translation) for Korean Patent Application No. 10-2008-7024792 dated Feb. 23, 2015.
Official Action (including translation) for Korean Patent Application No. 10-2008-7024792 dated Dec. 14, 2015.
Official Action (including translation) for Korean Patent Application No. 10-2008-7024792 dated Jul. 26, 2016.
Notice of Allowance (including translation) for Korean Patent Application No. 10-2008-7024792 dated Feb. 17, 2017.
Official Action (including translation) for Korean Patent Application No. 10-2014-7005299 dated Apr. 4, 2014.
Official Action (including translation) for Korean Patent Application No. 10-2014-7005299 dated Feb. 23, 2015.
Official Action (including translation) for Korean Patent Application No. 10-2014-7005299 dated Dec. 14, 2015.
Official Action (including translation) for Korean Patent Application No. 10-2017-7012757 dated Jun. 19, 2017.
Official Action (including translation) for Korean Patent Application No. 10-2017-7036067 dated Jan. 26, 2018.
Notice of Allowance (including translation) for Korean Patent Application No. 10-2017-7036067 dated Nov. 26, 2018.
Official Action (including translation) for Korean Patent Application No. 10-2019-7005116 dated Apr. 16, 2019.
Official Action (including translation) for Korean Patent Application No. 10-2019-7005116 dated Jan. 23, 2020.
Official Action (including translation) for Mexican Patent Application No. MX/a/2008/012505, dated Apr. 22, 2010.
Official Action (including translation) for Mexican Patent Application No. MX/a/2008/012505, dated Aug. 9, 2011.
Official Notification of Intent to Grant (including translation) for Mexican Patent Application No. MX/a/2008/012505, dated Apr. 3, 2012.
Official Action (including translation) for Mexican Patent Application No. MX/a/2011/005751, dated Jun. 6, 2013.
Official Action for U.S. Appl. No. 11/246,163, dated Feb. 24, 2009.
Official Action for U.S. Appl. No. 11/246,163, dated Dec. 9, 2009.
Notice of Allowability for U.S. Appl. No. 11/246,163, dated Sep. 7, 2010.
Notice of Allowability for U.S. Appl. No. 12/761,586, dated Oct. 6, 2010.
Notice of Allowability for U.S. Appl. No. 12/853,020, dated Oct. 6, 2010.
Official Action for U.S. Appl. No. 12/901,699, dated Jan. 6, 2012.
Notice of Allowance for U.S. Appl. No. 12/901,699, dated Jul. 27, 2012.
Official Action for U.S. Appl. No. 13/567,261, dated Sep. 28, 2012.
Notice of Allowance for U.S. Appl. No. 13/567,261, dated May 21, 2013.
Official Action for U.S. Appl. No. 13/942,938, dated Sep. 25, 2013.
Notice of Allowance for U.S. Appl. No. 13/942,938, dated Oct. 8, 2013.
Official Action for U.S. Appl. No. 14/081,469 dated Dec. 17, 2014.
Notice of Allowance for U.S. Appl. No. 14/081,469, dated Apr. 3, 2015.
Official Action for U.S. Appl. No. 14/730,874 dated Jun. 30, 2015.
Notice of Allowance for U.S. Appl. No. 14/730,874 dated Jan. 7, 2016.
Office Action for U.S. Appl. No. 15/046,821 dated Mar. 24, 2016.
Notice of Allowance for U.S. Appl. No. 15/046,821 dated Sep. 23, 2016.
Office Action for U.S. Appl. No. 15/372,841 dated Apr. 21, 2017.
Notice of Allowance for U.S. Appl. No. 15/372,841 dated Dec. 20, 2017.
Office Action for U.S. Appl. No. 15/874,277 dated Mar. 28, 2018.
Notice of Allowance for U.S. Appl. No. 15/874,277 dated Jun. 13, 2019.
Notice of Allowance for U.S. Appl. No. 16/261,109 dated Oct. 2, 2019.
Official Action for U.S. Appl. No. 12/295,828, dated Jan. 5, 2012.
Notice of Allowance for U.S. Appl. No. 12/295,828, dated Aug. 17, 2012.
Notice of Allowance for U.S. Appl. No. 12/783,758, dated Dec. 26, 2012.
Official Action for U.S. Appl. No. 13/766,059, dated Oct. 2, 2013.
Notice of Allowance for U.S. Appl. No. 13/766,059, dated Nov. 25, 2013.
Official Action for U.S. Appl. No. 14/159,125, dated Feb. 6, 2015.
Official Action for U.S. Appl. No. 14/159,125, dated Jun. 16, 2015.
Official Action for U.S. Appl. No. 14/159,125, dated Dec. 31, 2015.
Notice of Allowance for U.S. Appl. No. 14/159,125, dated Aug. 1, 2016.
Office Action for U.S. Appl. No. 15/298,526, dated Feb. 27, 2017.
Office Action for U.S. Appl. No. 15/298,526, dated Dec. 1, 2017.
Notice of Allowance for U.S. Appl. No. 15/298,526, dated Jun. 4, 2018.
Corrected Notice of Allowance for U.S. Appl. No. 15/298,526, dated Jun. 29, 2018.
Office Action for U.S. Appl. No. 16/046,494, dated Oct. 18, 2018.
Notice of Allowance for U.S. Appl. No. 16/046,494, dated Jun. 13, 2019.
Official Action for U.S. Appl. No. 12/760,728, dated Apr. 27, 2012.
Official Action for U.S. Appl. No. 12/760,728, dated Jan. 2, 2013.
Official Action for U.S. Appl. No. 12/760,728, dated Jun. 20, 2013.
Official Action for U.S. Appl. No. 12/760,728, dated Oct. 2, 2013.
Notice of Allowance for U.S. Appl. No. 12/760,728, dated Oct. 21, 2013.
Official Action for U.S. Appl. No. 12/783,765, dated May 17, 2012.
Official Action for U.S. Appl. No. 12/783,765, dated Dec. 17, 2012.
Notice of Allowance for U.S. Appl. No. 12/783,765, dated May 9, 2013.
Official Action for U.S. Appl. No. 14/075,194, dated Jan. 28, 2015.
Notice of Allowance for U.S. Appl. No. 14/075,194, dated Apr. 8, 2015.
Official Action for U.S. Appl. No. 14/742,334, dated Mar. 24, 2017.
Notice of Allowance for U.S. Appl. No. 14/742,334, dated Jun. 5, 2017.
Official Action for U.S. Appl. No. 15/678,870, dated Dec. 13, 2017.
Official Action for U.S. Appl. No. 15/678,870, dated Apr. 12, 2018.
Official Action for U.S. Appl. No. 15/678,870, dated Jan. 25, 2019.
Notice of Allowance for U.S. Appl. No. 15/678,870, dated Aug. 12, 2019.
Notice of Allowance for U.S. Appl. No. 15/678,870, dated Sep. 4, 2019.
Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Nov. 4, 2013-Oct. 19, 2015—Docket Nos., 1-122; (3,844 pages).
Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Nov. 10, 2015-Jan. 5, 2016—Docket Nos. 123-129; (102 pages).
Documents filed with District Court Proceedings for *TQ Delta, LLC v. 2Wire, Inc.*; U.S. District Court, for the District of Delaware

(56) References Cited

OTHER PUBLICATIONS (Wilmington); Civil Action No. 1:13-cv-01835-RGA; Includes documents filed from Jan. 20, 2016-Feb. 2, 2016—Docket Nos., 131-137; (104 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Feb. 9, 2016-Mar. 2, 2016—Docket Nos., 138-157; (228 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Aug. 31, 2015 and Mar. 17, 2016-Apr. 22, 2016—Docket Nos., 108 and 180-208; (194 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed on Feb. 25, 2016, mailed publicly available on May 25, 2016 Docket No. 155 (40 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Apr. 27, 2016-May 24, 2016; Docket Nos., 209-226; (813 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed on Mar. 6, 2016—made publicly available Jun. 1, 2016 Docket Nos., 158; (61 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Jun. 3, 2016-Jun. 6, 2016; Docket Nos., 227-228; (67 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed on Jun. 27, 2016; Docket Nos., 229; (2 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed on Aug. 2-Sep. 14, 2016; Docket Nos., 230-236; (58 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed on Sep. 26, 2016; Docket Nos., 238-239; (19 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Oct. 26, 2016-Nov. 17, 2016; Docket Nos., 240-245; (37 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed on Sep. 18, 2016 and made available on Dec. 19, 2016 Docket No. 237; (36 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed From Dec. 9, 2016-Feb. 3, 2017; Docket Nos. 246-265; (688 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed made available on Dec. 19, 2016; Docket No. 237; (36 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Feb. 6, 2017 to May 1, 2017; Docket Nos. 266-286; (124 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed on Feb. 10, 2017, made available on May 11, 2017; Docket Nos. 269; (52 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from May 2, 2017 to Jul. 14, 2017; Docket Nos. 287-335; (1183 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Jul. 24, 2017-Oct. 26, 2017; Docket Nos. 336-389; (3953 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed on Sep. 7, 2017 and made Publicly Available on Dec. 6, 2017; Docket No. 357; (156 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Oct. 27, 2017-Dec. 21, 2017; Docket Nos. 390-451; (1,411 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Feb. 1, 2018-Mar. 19, 2018; Docket Nos. 399, 430-431, and 453-504 (1,482 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents made Publicly Available on Mar. 26, 2018; Docket No. 452; (120 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents made Publicly Available on Apr. 16, 2018; Docket No. 463; (145 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents made Publicly Available on May 9, 2018; Docket No. 487; (52 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Mar. 27, 2018-Jun. 11, 2018; Docket Nos. 505-530; (450 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents made publicly available on Jul. 12, 2018; Docket No. 514; (63 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Jun. 11, 2018-Sep. 10, 2018; Docket Nos. 531-558; (133 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents made publicly available on Oct. 25, 2018; Docket No. 543; (94 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Sep. 11, 2018-Nov. 21, 2018; Docket Nos. 559-580; (317 pages).

(56) References Cited

OTHER PUBLICATIONS

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Dec. 10, 2018-Feb. 9, 2019; Docket Nos. 581-698; (5,536 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Feb. 11, 2019-May 9, 2019; Docket Nos. 699-1139; (12,491 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents made publicly available on Jun. 13, 2019; Docket No. 951; (19 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from May 9, 2019-Jul. 15, 2019; Docket Nos. 1140-1227; (1076 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents made publicly available on Aug. 13, 2019; Docket Nos. 1148-1149; (138 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Jul. 19, 2019-Sep. 17, 2019; Docket Nos. 1228-1233 and 1238-1242; (177 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents made publicly available on Nov. 4, 2019; Docket Nos. 1234-137; (890 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Dec. 16, 2019-Dec. 20, 2019; Docket Nos. 1228-1233 and 1243-1246; (4 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Jan. 7, 2020-Feb. 14, 2020; Docket Nos. 1247-1295; (379 pages).

Defendant 2Wire, Inc.'s Preliminary Invalidity Contentions with Regard to Representative Asserted Claims for *TQ Delta, LLC v. 2Wire, Inc.*—Including Claim Charts for Family 3 with Exhibits F-1 to F-9 and G-1 to G-25; In the United States District Court for the District of Delaware; Civil Action No. 13-01835-RGA; filed Sep. 24, 2015 (539 pages).

Defendant 2Wire, Inc.'s Invalidity Contentions in Response to TQ Delta's Dec. 8, 2016 Final Infringement Contentions Including Claim Charts for Family 3 with Exhibits F-1 to F-9 and G-1 to G-25; In the United States District Court for the District of Delaware; Civil Action No. 13-01835-RGA; filed Jan. 23, 2017 (537 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed from Nov. 4, 2013-Nov. 30, 2015—Docket Nos. 1-100; (1722 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed from Dec. 16, 2015-Jan. 6, 2016—Docket Nos. 104-112; (193 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed from Jan. 20, 2016-Feb. 8, 2016—Docket Nos. 113-124; (252 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed from Feb. 9. 2016-Mar. 2, 2016—Docket Nos. 125-142; (225 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed from Mar. 17, 2016-Apr. 22, 2016; Docket Nos. 165-193; (152 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed on Feb. 25, 2016, made publicly available May 25, 2016; Docket No. 140; (40 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed from Apr. 27, 2016-May 24, 2016; Docket Nos. 194-211; (813 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed on Mar. 3, 2016 made publicly available June 1, 2016; Docket Nos. 143; (61 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed from Jun. 3, 2016-Jun. 7, 2016; Docket Nos., 212-215; (138 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed from Jun. 27, 2016-Jun. 7, 201; Docket Nos. 216; (2 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed from Aug. 2-Aug. 23, 2016; Docket Nos. 217-219; (9 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed from Sep. 16, 2016; Docket Nos. 220; (2 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed on Sep. 26, 2016; Docket Nos. 221-222; (19 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed Oct. 26, 2016-Nov. 17, 2016; Docket Nos., 223-227; (35 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed Dec. 9, 2016-Feb. 3, 2017; Docket Nos., 228-236; (121 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed Feb. 8, 2017 to Apr. 26, 2017; Docket Nos., 237-253; (118 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed on Feb. 10, 2017, made available on May 11, 2017; Docket Nos., 239; (52 pages).

(56) References Cited

OTHER PUBLICATIONS

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed May 2, 2017 to Jul. 14, 2017; Docket Nos., 254-299; (1080 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed Jul. 24, 2017-Oct. 25, 2017; Docket Nos., 300-352; (3668 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed Sep. 7, 2017, made Publicly Available on Dec. 6, 2017; Docket No. 323; (156 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed Oct. 30, 2017-Dec. 5, 2017; Docket Nos., 353-375; (862 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed Feb. 1, 2018-Mar. 6, 2018; Docket Nos., 358, 376, and 377 (326 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents made Publicly Available on Mar. 26, 2018; Docket No. 378 (120 pages).

Defendant Zhone Technologies, Inc.'s Invalidity Contentions with Regard to Representative Asserted Claims for *TQ Delta, LLC v. Zhone Technologies Inc.*—Including Claim Charts for Family 3 with Exhibits 43-79; In the United States District Court for the District of Delaware; Civil Action No. 13-01836-RGA; filed Sep. 25, 2015 (961 pages).

Defendant Zhone Technologies, Inc.'s Final Invalidity Contentions in Response to Plaintiff's Final Infringement Charts Regarding Non-Broadcom Products for *TQ Delta, LLC v. Zhone Technologies Inc.*—Including Claim Charts for Family 3 with Exhibits 58-94; In the United States District Court for the District of Delaware; Civil Action No. 13-01836-RGA; filed Jan. 23, 2017 (945 pages).

Defendant Zhone Technologies, Inc.'s Invalidity Contentions with Regard to Representative Asserted Claims for *TQ Delta, LLC v. Zhone Technologies Inc.*—Including Claim Charts for Family 9 with Exhibits 138-150; In the United States District Court for the District of Delaware; Civil Action No. 13-01836-RGA; filed Sep. 25, 2015 (246 pages).

Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Dec. 9, 2013-Nov. 30, 2015—Docket Nos., 1-117; (1996 pages).

Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Dec. 16, 2015-Dec. 16, 2015—Docket Nos., 119; (48 pages).

Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Jan. 20, 2016-Feb. 8, 2016—Docket Nos., 125-139; (349 pages).

Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Feb. 9, 2016-Mar. 2, 2016; Docket Nos. 140-157; (223 pages).

Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Mar. 17, 2016-Apr. 22, 2016; Docket Nos. 180-208; (152 pages).

Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed on Feb. 25, 2016, made publicly available May 25, 2016; Docket No. 155; (40 pages).

Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Apr. 27, 2016-May 24, 2016; Docket Nos. 209-226; (809 pages).

Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed on Mar. 3, 2016, made publicly Jun. 1, 2016; Docket No. 158; (61 pages).

Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Jun. 3, 2016-Jun. 13, 2016; Docket Nos. 227-232; (140 pages).

Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Jun. 14, 2016; Docket Nos. 233; (2 pages).

Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed on Jun. 27, 2016; Docket Nos. 235; (2 pages).

Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Aug. 2, 2016-Sep. 1, 2016; Docket Nos. 236-239; (11 pages).

Documents filed with District Court Proceedings for *TQ Delta, LLC v. Zyxel Communications Inc. et al.*; U,S. District Court, for the District of Delaware (Wilmington); Civil Action No. 1:13-cv-02013-RGA; Includes documents filed on Sep. 26, 2016; Docket Nos. 240-241; (19 pages).

Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Oct. 26, 2016-Nov. 17, 2016; Docket Nos. 242-246; (35 pages).

Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Dec. 9, 2016-Feb. 3, 2017; Docket Nos. 247-256; (23 pages).

Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Feb. 8, 2017-May 1, 2017; Docket Nos. 257-273; (69 pages).

Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed on Feb. 10, 2017, made available on May 11, 2017; Docket Nos. 259; (52 pages).

Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from May 2, 2017-Jul. 14, 2017; Docket Nos. 274-320; (1080 pages).

Documents filed with District Court Proceedings for *TQ Delta, LLC v. Zyxel Communications Inc. et al.*; U.S. District Court, for the District of Delaware (Wilmington); Civil Action No. 1:13-cv-02013-

(56) References Cited

OTHER PUBLICATIONS

RGA; Includes documents filed from Jul. 24, 2017-Oct. 25, 2017; Docket Nos. 321-372; (3670 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Sep. 7, 2017, made Publicly Available on Dec. 6, 2017; Docket No. 342; (156 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Oct. 27, 2017-Dec. 21, 2017; Docket Nos. 373-434; (1,843 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Feb. 1, 2018-Mar. 19, 2018; Docket Nos. 378, 407-408; and 436-502; (4,366 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents made Publicly available on Mar. 26, 2018; Docket No. 435; (120 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents made Publicly available on Apr. 16, 2018; Docket No. 454; (145 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents made Publicly available on Apr. 17, 2018; Docket No. 454; (42 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents made Publicly available on May 10, 2018; Docket No. 482; (52 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents made Publicly available on May 14, 2018; Docket No. 485; (101 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Mar. 29, 2018-Jun. 8, 2018; Docket Nos. 503-534; (465 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents made publicly available on Jul. 12, 2018; Docket No. 513; (118 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Jun. 11, 2018-Sep. 10, 2018; Docket Nos. 535-580; (272 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents made publicly available on Oct. 25, 2018; Docket No. 559; (94 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Sep. 18, 2018-Nov. 27, 2018; Docket Nos. 581-602; (302 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Dec. 3, 2018-Feb. 6, 2019; Docket Nos. 603-617; (35 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Feb. 13, 2019-May 8, 2019; Docket Nos. 618-628; (21 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from May 16, 2019-Jul. 3, 2019; Docket Nos. 629-633; (11 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Aug. 21, 2019-Oct. 2, 2019; Docket Nos. 634-638; (9 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Oct. 9, 2019-Dec. 19, 2019; Docket Nos. 639-687; (2583 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Dec. 23, 2019-Jan. 8, 2020; Docket Nos. 688-692; (12 pages).
Defendant Zyxel's Initial Invalidity Contentions with Respect to Representative Asserted Claims for *TQ Delta, LLC v. Zyxel Communications, Inc. and Zyxel Communications Corporation*—Including Claim Charts for Family 3 with Exhibits C1-C36; In the United States District Court for the District of Delaware; Civil Action No. 13-02013-RGA; filed Sep. 25, 2015 (729 pages).
Defendant Zyxel's Technologies, Inc.'s Final Invalidity Contentions in Response to Plaintiff's Dec. 8, 2016 Final Infringement Charts Regarding Non-Broadcom Products for *TQ Delta, LLC v. Zyxel Communications, Inc. and Zyxel Communications Corporation*—Including Claim Charts for Family 3 with Exhibits C1-C30 and C32-C36; In the United States District Court for the District of Delaware; Civil Action No. 13-02013-RGA; filed Jan. 23, 2017 (754 pages).
Defendant Zyxel's Initial Invalidity Contentions with Respect to Representative Asserted Claims for *TQ Delta, LLC v. Zyxel Communications, Inc. and Zyxel Communications Corporation*—Including Claim Charts for Family 9 with Exhibits J2-J13; In the United States District Court for the District of Delaware; Civil Action No. 13-2013-RGA; filed Sep. 25, 2015 (236 pages).
Defendant Zyxel's Technologies, Inc.'s Final Invalidity Contentions in Response to Plaintiff's Dec. 8, 2016 Final Infringement Charts Regarding Non-Broadcom Products for *TQ Delta, LLC v. Zyxel Communications, Inc. and Zyxel Communications Corporation*—Including Claim Charts for Family 9 with Exhibits J8-J14; In the United States District Court for the District of Delaware; Civil Action No. 13-2013-RGA; filed Jan. 23, 2017 (225 pages).
Documents filed with District Court Proceedings for *TQ Delta, LLC v. Adtran Inc.*; U.S. District Court, for the District ol Delaware (Wilmington); Civil Action No. 1:14-cv-00954-RGA; Includes documents filed from Jul. 17, 2014-Oct. 19, 2015—Docket Nos., 1-65; (2,489 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Jan. 20, 2016-Feb. 8, 2016—Docket Nos., 67-68; (81 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Feb. 9, 2016-Mar. 1, 2016 Docket Nos., 69-72; (13 pages).
Documents filed with District Court Proceedings for *TQ Delta, LLC v. Adtran Inc.*; U.S. District Court, for the District of Delaware

(56) References Cited

OTHER PUBLICATIONS (Wilmington); Civil Action No. 1:14-cv-00954-RGA; Includes documents filed from Mar. 28, 2016-May 31, 2016—Docket Nos., 74-77; (8 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Mar. 8, 2016, made publicly available Jun. 6, 2016—Docket No., 73; (60 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Jun. 7, 2016-Jun. 8, 2016; Docket Nos., 78-80; (73 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Jun. 15, 2016; Docket Nos., 81; (2 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed on Jun. 27, 2016; Docket Nos., 82; (2 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Aug. 2-Sep. 1, 2016; Docket Nos., 83-86; (11 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Nov. 4, 2016-Nov. 17, 2016; Docket Nos., 87-90; (11 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Dec. 9, 2016-Feb. 3, 2017; Docket Nos., 91-99; (19 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Feb. 8, 2017-May 1, 2017; Docket Nos., 100-118; (128 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed on Feb. 10, 2017, made available on May 11, 2017; Docket Nos. 102; (52 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from May 2, 2017-Jul. 14, 2017; Docket Nos., 119-167; (1087 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Jul. 21, 2017-Oct. 26, 2017; Docket Nos., 168-233; (4038 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Sep. 7, 2017, made Publicly Available on Dec. 6, 2017; Docket No. 197; (157 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Oct. 27, 2017-Dec. 21, 2017; Docket Nos., 234-290; (1664 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Feb. 1, 2018-Mar. 19, 2018; Docket Nos. 242; 266-267; and 292-359 (4,228 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents made publicly available on Mar. 26, 2018; Docket No. 291 (120 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents made Publicly available on Apr. 16, 2018; Docket No. 310 (145 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents made Publicly available on May 10, 2018; Docket No. 338 (52 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents made Publicly available on May 14, 2018; Docket No. 342 (101 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Mar. 29, 2018-Jun. 7, 2018; Docket Nos. 360-419 (956 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents made publicly available on Jul. 12, 2018; Docket Nos. 370-371 (181 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Jul. 3, 2018-Sep. 10, 2018; Docket Nos. 420-491 (696 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents made publicly available on Oct. 25, 2018; Docket No. 462 (94 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Sep. 18, 2018-Nov. 21, 2018; Docket Nos. 492-524 (486 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Dec. 3, 2018-Feb. 6, 2019; Docket Nos. 525-553 (543 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Feb. 22, 2019-May 9, 2019; Docket Nos. 554-573 (36 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from May 10, 2019-Jul. 16, 2019; Docket Nos. 574-657 (1435 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Jul. 17. 2019-Sep. 27, 2019; Docket Nos. 658-838 (7239 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Sep. 30, 2019-Oct. 8, 2019; Docket Nos. 839-877 (344 pages).

(56) References Cited

OTHER PUBLICATIONS

Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Oct. 9, 2019-Dec. 20, 2019; Docket Nos. 878-930 (1152 pages).

Documents filed with District Court Proceedings for *TQ Delta, LLC v. Adtran Inc.*; U.S. District Court, for the District of Delaware (Wilmington); Civil Action No. 1:14-cv-00954-RGA; Includes documents made publicly available on Jan. 28, 2020; Docket No. 908 (41pages).

Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Dec. 23, 2019-Feb. 13, 2020; Docket Nos. 931-947 (33 pages).

Defendant Adtran, Inc.'s Preliminary Invalidity Contentions with Regard to Representative Asserted Claims for *TQ Delta, LLC v. Adtran, Inc.*—Including Claim Charts for Family 3 as Exhibits 3-1-3-28; U.S. District Court, for the District of Delaware (Wilmington); Civil Action No. 1:14-cv-00954-RGA and Civil Action No. 1:15-cv-00121-RGA; filed Feb. 9, 2016 (643 pages).

Defendant Adtran, Inc.'s Preliminary Invalidity Contentions with Regard to Representative Asserted Claims for *TQ Delta, LLC v. Adtran, Inc.*—Including Claim Charts for Family 9 as Exhibits 9-1-9-23; U.S. District Court, for the District of Delaware (Wilmington); Civil Action No. 1:14-cv-00954-RGA and Civil Action No. 1:15-cv-00121-RGA; filed Feb. 9, 2016 (406 pages).

Defendant Adtran, Inc.'s Invalidity Contentions in Response to TQ Delta's Dec. 8, 2016 Final Infringement Contentions for *TQ Delta, LLC v. Adtran, Inc.*—Including Claim Charts for Family 9 as Exhibits 9-1-9-23; U.S. District Court, for the District of Delaware (Wilmington); Civil Action No. 1:14-cv-00954-RGA and Civil Action No. 1:15-cv-00121-RGA; filed Jan. 23, 2017 (347 pages).

Documents filed with District Court Proceedings for *Adtran Inc. v. TQ Delta, LLC*; U.S. District Court, for the District of Delaware (Wilmington); Civil Action No. 1:15-cv-00121-RGA; Includes documents filed from Jul. 17, 2014-Mar. 1, 2016 Docket Nos., 1-77; (1,444) pages).

Documents filed with District Court Proceedings for *Adtran Inc. v. TQ Delta, LLC*; U.S. District Court, for the District of Delaware (Wilmington); Civil Action No. 1:15-cv-00121-RGA; Includes documents filed from Mar. 28, 2016-May 31, 2016; Docket Nos., 79-82; (8 pages).

Documents filed with District Court Proceedings for *Adtran Inc. v. TQ Delta, LLC*; U.S. District Court, for the District of Delaware (Wilmington); Civil Action No. 1:15-cv-00121-RGA; Includes documents on Mar. 8, 2016 made publicly available Jun. 6, 2016; Docket Nos., 78; (60 pages).

Documents filed with District Court Proceedings for *Adtran Inc. v. TQ Delta, LLC*; U.S. District Court, for the District of Delaware (Wilmington); Civil Action No. 1:15-cv-00121-RGA; Includes documents filed from Jun. 7, 2016-Jun. 8, 2016; Docket Nos., 83-85; (73 pages).

Documents filed with District Court Proceedings for *Adtran Inc. v. TQ Delta, LLC*; U.S. District Court, for the District of Delaware (Wilmington); Civil Action No. 1:15-cv-00121-RGA; Includes documents filed from Jun. 15, 2016; Docket Nos., 86; (2 pages).

Documents filed with District Court Proceedings for *Adtran Inc. v. TQ Delta, LLC*; U.S. District Court, for the District of Delaware (Wilmington); Civil Action No. 1:15-cv-00121-RGA; Includes documents filed on Jun. 27, 2016; Docket Nos., 87; (2 pages).

Documents filed with District Court Proceedings for *Adtran Inc. v. TQ Delta, LLC*; U.S. District Court, for the District of Delaware (Wilmington); Civil Action No. 1:15-cv-00121-RGA; Includes documents filed from Aug. 2-Sep. 1, 2016; Docket Nos., 88-91; (11 pages).

Documents filed with District Court Proceedings for *Adtran Inc. v. TQ Delta, LLC*; U.S. District Court, for the District of Delaware (Wilmington); Civil Action No. 1:15-cv-00121-RGA; Includes documents filed from Nov. 4, 2016-Nov. 17, 2016; Docket Nos., 92-95; (11 pages).

Documents filed with District Court Proceedings for *Adtran Inc. v. TQ Delta, LLC*; U.S. District Court, for the District of Delaware (Wilmington); Civil Action No. 1:15-cv-00121-RGA; Includes documents filed from Dec. 9, 2016-Feb. 3, 2017; Docket Nos., 96-104 (19 pages).

Documents filed with District Court Proceedings for *Adtran Inc. v. TQ Delta, LLC*; U.S. District Court, for the District of Delaware (Wilmington); Civil Action No. 1:15-cv-00121-RGA; Includes documents filed from Feb. 8, 2017-May 1, 2017; Docket Nos., 105-122 (118 pages).

Documents filed with District Court Proceedings for *Adtran Inc. v. TQ Delta, LLC*; U.S. District Court, for the District of Delaware (Wilmington); Civil Action No. 1:15-cv-00121-RGA; Includes documents filed on Feb. 10, 2017, made available on May 11, 2017; Docket Nos. 107; (52 pages).

Documents filed with District Court Proceedings for *Adtran Inc. v. TQ Delta, LLC*; U.S. District Court, for the District ol Delaware (Wilmington); Civil Action No. 1:15-cv-00121-RGA; Includes documents filed from May 2, 2017-Jul. 14, 2017; Docket Nos., 122-169 (1083 pages).

Documents filed with District Court Proceedings for *Adtran Inc. v. TQ Delta, LLC*; U.S. District Court, for the District of Delaware (Wilmington); Civil Action No. 1:15-cv-00121-RGA; Includes documents filed from Jul. 21, 2017-Oct. 26, 2017; Docket Nos., 170-235 (4150 pages).

Documents filed with District Court Proceedings for *Adtran Inc. v. TQ Delta, LLC*; U.S. District Court, for the District of Delaware (Wilmington); Civil Action No. 1:15-cv-00121-RGA; Includes documents filed from Sep. 7, 2017, made Publicly Available on Dec. 6, 2017; Docket No. 199; (157 pages).

Documents filed with District Court Proceedings for *Adtran Inc. v. TQ Delta, LLC*; U.S. District Court, for the District of Delaware (Wilmington); Civil Action No. 1:15-cv-00121-RGA; Includes documents filed from Oct. 27, 2017-Dec. 21, 2017; Docket Nos., 236-291 (1662 pages).

Documents filed with District Court Proceedings for *Adtran Inc. v. TQ Delta, LLC*; U.S. District Court, for the District of Delaware (Wilmington); Civil Action No. 1:15-cv-00121-RGA; Includes documents filed from Feb. 1, 2018-Mar. 19, 2018; Docket Nos. 242, 267-268, and 293-360 (4,228 pages).

Documents filed with District Court Proceedings for *Adtran Inc. v. TQ Delta, LLC*; U.S. District Court, for the District of Delaware (Wilmington); Civil Action No. 1:15-cv-00121-RGA; Includes documents made Publicly available on Mar. 26, 2018; Docket No. 292 (120 pages).

Documents filed with District Court Proceedings for *Adtran Inc. v. TQ Delta, LLC*; U.S. District Court, for the District of Delaware (Wilmington); Civil Action No. 1:15-cv-00121-RGA; Includes documents made Publicly available on Apr. 16, 2018; Docket No. 313 (145 pages).

Documents filed with District Court Proceedings for *Adtran Inc. v. TQ Delta, LLC*; U.S. District Court, for the District of Delaware (Wilmington); Civil Action No. 1:15-cv-00121-RGA; Includes documents made Publicly available on May 10, 2018; Docket No. 341 (52 pages).

Documents filed with District Court Proceedings for *Adtran Inc. v. TQ Delta, LLC*; U.S. District Court, for the District of Delaware (Wilmington); Civil Action No. 1:15-cv-00121-RGA; Includes documents made Publicly available on May 14, 2018; Docket No. 345 (101 pages).

Documents filed with District Court Proceedings for *Adtran Inc. v. TQ Delta, LLC*; U.S. District Court, for the District of Delaware (Wilmington); Civil Action No. 1:15-cv-00121-RGA; Includes documents filed from Mar. 29, 2018-Jun. 7, 2018; Docket Nos. 361-420 (956 pages).

Documents filed with District Court Proceedings for *Adtran Inc. v. TQ Delta, LLC*; U.S. District Court, for the District of Delaware (Wilmington); Civil Action No. 1:15-cv-00121-RGA; Includes documents made publicly on Jul. 12, 2018; Docket Nos. 371-372 (181 pages).

(56) References Cited

OTHER PUBLICATIONS

Documents filed with District Court Proceedings for *Adtran Inc.* v. *TQ Delta, LLC*; U.S. District Court, for the District of Delaware (Wilmington); Civil Action No. 1:15-cv-00121-RGA; Includes documents filed from Jun. 11, 2018-Sep. 10, 2018; Docket Nos. 421-490 (693 pages).

Documents filed with District Court Proceedings for *Adtran Inc.* v. *TQ Delta, LLC*; U.S. District Court, for the District of Delaware (Wilmington); Civil Action No. 1:15-cv-00121-RGA; Includes documents made publicly available on Oct. 25, 2018; Docket No. 463 (94 pages).

Documents filed with District Court Proceedings for *Adtran Inc.* v. *TQ Delta, LLC*; U.S. District Court, for the District of Delaware (Wilmington); Civil Action No. 1:15-cv-00121-RGA; Includes documents filed from Sep. 18, 2018-Nov. 21, 2018; Docket Nos. 491-523 (486 pages).

Documents filed with District Court Proceedings for *Adtran Inc.* v. *TQ Delta, LLC*; U.S. District Court, for the District of Delaware (Wilmington); Civil Action No. 1:15-cv-00121-RGA; Includes documents filed from Dec. 3, 2018-Feb. 6, 2019; Docket Nos. 524-552 (543 pages).

Documents filed with District Court Proceedings for *Adtran Inc.* v. *TQ Delta, LLC*; U.S. District Court, for the District of Delaware (Wilmington); Civil Action No. 1:15-cv-00121-RGA; Includes documents filed from Feb. 22, 2019-May 9, 2019; Docket Nos. 553-571 (35 pages).

Documents filed with District Court Proceedings for *Adtran Inc.* v. *TQ Delta, LLC*; U.S. District Court, for the District of Delaware (Wilmington); Civil Action No. 1:15-cv-00121-RGA; Includes documents filed from May 10, 2019-Jul. 16. 2019; Docket Nos. 572-653 (1433 pages).

Documents filed with District Court Proceedings for *Adtran Inc.* v. *TQ Delta, LLC*; U.S. District Court, for the District of Delaware (Wilmington); Civil Action No. 1:15-cv-00121-RGA; Includes documents filed from Jul. 17, 2019-Sep. 30, 2019; Docket Nos. 654-839 (7268 pages).

Documents filed with District Court Proceedings for *Adtran Inc.* v. *TQ Delta, LLC*; U.S. District Court, for the District of Delaware (Wilmington); Civil Action No. 1:15-cv-00121-RGA; Includes documents filed from Oct. 1, 2019-Oct. 8. 2019; Docket Nos. 840-874 (316 pages).

Documents filed with District Court Proceedings for *Adtran Inc.* v. *TQ Delta, LLC*; U.S. District Court, for the District of Delaware (Wilmington); Civil Action No. 1:15-cv-00121-RGA; Includes documents filed from Oct. 9, 2019-Dec. 20, 2019; Docket Nos. 875-926 (1151 pages).

Documents filed with District Court Proceedings for *Adtran Inc.* v. *TQ Delta, LLC*; U.S. District Court, for the District of Delaware (Wilmington); Civil Action No. 1:15-cv-00121-RGA; includes documents made publicly available on Jan. 28, 2020; Docket No. 905 (41 pages).

Documents filed with District Court Proceedings for *Adtran Inc.* v. *TQ Delta, LLC*; U.S. District Court, for the District of Delaware (Wilmington); Civil Action No. 1:15-cv-00121-RGA; Includes documents filed from Dec. 23, 2019-Feb. 13, 2020; Docket Nos. 927-943 (33 pages).

Documents filed with District Court Proceedings for *Adtran Inc.* v. *TQ Delta, LLC*; U.S. District Court, for the Northern District of Alabama (Northeastern); Civil Action No. 5:14-cv-01381-JEO; Includes documents filed from Jul. 17, 2014-Jan. 27, 2015—Docket Nos., 1-32; (568 pages).

Office Action for European Patent Application No. 17020525.6 dated May 13, 2020.

Notice of Allowance (including translation) for Korean Patent Application No. 10-2019-7005116 dated Jun. 29, 2020.

Documents filed with District Court Proceedings for *TQ Delta, LLC* v. *2WIRE, Inc.*; U.S. District Court, for the District of Delaware (Wilmington); Civil Action No. 1:13-cv-01835-RGA; Includes documents filed from Aug. 3, 2020-Aug. 26, 2020; (35 pages).

Documents filed with District Court Proceedings for *TQ Delta, LLC* v. *Adtran Inc.*; U.S. District Court, for the District of Delaware (Wilmington); Civil Action No. 1:14-cv-00954-RGA; Includes documents made publicly available on Aug. 7, 2020; (50 pages).

Documents filed with District Court Proceedings for *TQ Delta, LLC* v. *Adtran Inc.*; U.S. District Court, for the District of Delaware (Wilmington); Civil Action No. 1:14-cv-00954-RGA; Includes documents filed from Jul. 28, 2020-Aug. 26, 2020; (472 pages).

Documents filed with District Court Proceedings for *Adtran Inc.* v. *TQ Delta, LLC*; U.S. District Court, for the District of Delaware (Wilmington); Civil Action No. 1:15-cv-00121-RGA; Includes documents made publicly available on Aug. 7, 2020; (50 pages).

Documents filed with District Court Proceedings for *Adtran Inc.* v. *TQ Delta, LLC*; U.S. District Court, for the District of Delaware (Wilmington); Civil Action No. 1 :15-cv-00121-RGA; Includes documents filed on Jul. 28, 2020; (23 pages).

\* cited by examiner

TECHNIQUES FOR PACKET AND MESSAGE COMMUNICATION IN A MULTICARRIER TRANSCEIVER ENVIRONMENT

RELATED APPLICATION DATA

This application is a Continuation of U.S. patent application Ser. No. 15/678,870, filed Aug. 16, 2017, now U.S. Pat. No. 10,498,495, which is a Continuation of U.S. patent application Ser. No. 14/742,334, filed Jun. 17, 2015, now U.S. Pat. No. 9,749,235, which is a Continuation of U.S. patent application Ser. No. 14/075,194, filed Nov. 8, 2013, now U.S. Pat. No. 9,094,348, which is a Continuation of U.S. patent application Ser. No. 12/760,728, filed Apr. 15, 2010, now U.S. Pat. No. 8,595,577, which is a Divisional of U.S. patent application Ser. No. 12/295,828, filed Oct. 2, 2008, now U.S. Pat. No. 8,335,956, which is a national stage application under 35 U.S.C. 371 of PCT Application No. PCT/US007/066522 having, an international filing date of Apr. 12, 2007, which designated the United States, which PCT application claims the benefit of and priority under 35 U.S.C. § 119(e) to U.S. Patent Application Nos. 60/792,236, filed Apr. 12, 2006, entitled "xDSL Packet Retransmission Mechanism," and 60/849,650, filed Oct. 5, 2006, entitled "xDSL Packet Retransmission Mechanism with Examples," each of which are incorporated herein by reference in their entirety.

BACKGROUND

Field of the Invention

This invention generally relates to communication systems. More specifically, an exemplary embodiment of this invention relates to retransmission of packets in a communication environment. An exemplary embodiment of this invention also relates to memory sharing between transmission functions and other transceiver functions.

SUMMARY

Exemplary aspects of the invention relate to handling of packets and the assignment of a packet handling identifier. Exemplary aspects relate to sharing of resources between retransmitted packets and other transceiver functions. In addition, exemplary aspects relate to sharing of resources between packets associated with the packet handling identifier and other transceiver functions.

More specifically, aspects of the invention relate to assigning a packet handling identifier to one or more packets. Based on the packet handling identifier, a packet can either be, for example, forwarded directly to another communication device (or layer) or, alternatively, held for possible retransmission protocols. For example, packets received from, for example, a higher-layer of a communication device, can be designated to have a specific packet handling identifier, such as a Quality of Service (QOS) level. The QOS level of a packet indicates the importance of certain service metrics (or characteristics) of one or more packets.

Two exemplary QOS metrics are delay (or latency) and Packet Error Rate (PER). While these two metrics are used for illustrative purposes herein, it should be appreciated that other metrics can also be used with this invention. For example, other QOS metrics could include one or more of a Bit Error Rate (BER), data rate, delay variation (or jitter), packet loss rate, time between error events (TBE), or the like.

As an example, in the case where the two QOS metrics are latency and PER, packets containing, for example, video information (such as IPTV) may have the requirement for a very low packet error rate but can often tolerate higher delay. In contrast, voice or data (e.g., gaming) traffic may have very low latency requirements but can tolerate a higher packet error rate. For this particular example, the video packets could be designated as "low-PER" QOS packets and the voice or data packets could be designated as "low-latency" QOS packets. For example, a specific QOS identifier could be assigned to the low-latency packets while a different QOS identifier could be assigned to the low-PER packets. The low-latency packets could be forwarded directly to another transceiver, or a higher layer, while the low-PER packets can be stored in a retransmission buffer, e.g., memory, that can be used to reduce packet error.

As mentioned above, exemplary aspects also relate to sharing of resources between a retransmission function and other transceiver functions.

The exemplary systems and methods of this invention can utilize memory, such as a retransmission buffer, for the storing of packets for retransmission functions. Since other transceiver functions may also require memory to perform certain functionality, an exemplary aspect of this invention also relates to sharing the memory for retransmission functions with the memory required for other transceiver functions. For example, memory can be dynamically allocated based on configuration settings or noise conditions and, for example, the memory divided between one or more of interleaving/deinterleaving, RS Coding/Decoding functionality and the functionality used retransmission.

Aspects of the invention thus relate to identification of one or more packets.

Additional aspects of the invention relate to identifying one or more packets that can be retransmitted.

Still further aspects of the invention relate to identifying one or more packets that should not be retransmitted.

Aspects of the invention also relate to retransmission of one or more of an IP packet, an Ethernet packet, an ATM cell, a PTM packet, an ADSL Mux-data frame, a PTM-TC codeword, and RS codeword and a DMT symbols.

Still further aspects of the invention relate to appending an identifier to a packet.

Still further aspects of the invention relate to appending a sequence identifier to at least one packet.

Aspects of the invention also relate to routing one or more packets based on a packet handling identifier.

Aspects of the invention also relate to retransmitting a packet.

Aspects of the invention further relate to retransmit a packet based on a retransmission request.

Still further aspects of the invention relate to sharing memory between a retransmission function and one or more of an interleaver, deinterleaver, coder, decoder and other transceiver functionalities.

Other more specific aspects of the invention relate to sharing memory between a retransmission buffer (or memory) and interleaving/deinterleaving and/or coding/decoding functionality.

Additional exemplary, non-limiting aspects of the invention are:

1. A method of packet retransmission comprising:
   transmitting or receiving a plurality of packets;
   identifying at least one packet of the plurality of packets as a packet that should not be retransmitted.
2. The method of aspect 1, wherein the packet is any grouping of bytes.
3. The method of aspect 1, wherein the packet is one of an IP packet, an Ethernet packet, an ATM cell, a PTM packet, an ADSL Mux-Data Frame, a PTM-TC codeword, an RS codeword and a DMT symbol.
4. The method of aspect 1, wherein a bit field comprising a sequence identifier (SID) is appended to each packet.
5. The method of aspect 4, wherein the identifying step comprises using a special value for a sequence identifier (SID).
6. The method of aspect 4, wherein the appended bit field comprises a dedicated CRC.
7. The method of aspect 1, wherein the at least one packet is not stored for retransmission.
8. The method of aspect 1, wherein the at least one packet is passed immediately to a high layer.
9. A packet retransmission module capable of transmitting or receiving a plurality of packets and capable of identifying at least one packet of the plurality of packets as a packet that should not be retransmitted.
10. The module of aspect 9, wherein the packet is any grouping of bytes.
11. The module of aspect 9, wherein the packet is one of an IP packet, an Ethernet packet, an ATM cell, a PTM packet, an ADSL Mux-Data Frame, a PTM-TC codeword, an RS codeword and a DMT symbol.
12. The module of aspect 9, wherein the module is capable of appending a bit field comprising a sequence identifier (SID) to each packet.
13. The module of aspect 12, wherein the identifying comprises using a special value for the SID.
14. The module of aspect 12, wherein the appended bit field comprises a dedicated CRC.
15. The module of aspect 9, wherein the at least one packet is not stored by the module for retransmission.
16. The module of aspect 9, wherein the at least one packet is passed by the module immediately to a high layer.
17. The module of aspect 9, wherein the module is implemented in one or more of a wireless transceiver, a wireless LAN station, a wired transceiver, a DSL modem, an ADSL modem, an xDSL modem, a VDSL modem, a multicarrier transceiver, a general purpose computer, a special purpose computer, a programmed microprocessor, a microcontroller and peripheral integrated circuit element(s), an ASIC, a digital signal processor, a hard-wired electronic or logic circuit and a programmable logic device.
18. The module of aspect 9, wherein the module is implemented in one or more of a PTM-TC, ATM-TC, PMD and PMS-TC.
19. A method comprising sharing memory between an interleaving and/or deinterleaving memory and a packet retransmission memory.
20. A method comprising allocating a first portion of shared memory for retransmission and a second portion of the shared memory for interleaving and/or deinterleaving.
21. The method of aspect 20, further comprising transmitting or receiving a message indicating how to allocate the shared memory.
22. The method of aspect 19 or 20, further comprising transmitting or receiving a message indicating how to share the memory.
23. A memory capable of being shared between an interleaving and/or deinterleaving buffer and a packet retransmission buffer.
24. A module capable of allocating a first portion of shared memory for retransmission and a second portion of the shared memory for interleaving and/or deinterleaving.
25. The module of aspect 24, wherein the module is capable of transmitting or receiving a message indicating how to allocate the shared memory.
26. The module of aspect 24, wherein the module is capable of transmitting or receiving a message indicating how to share the memory.
27. The module of aspect 24, wherein the module is one or more of a wireless transceiver, a wireless LAN station, a wired transceiver, a DSL modem, an ADSL modem, an xDSL modem, a VDSL modem, a multicarrier transceiver, a general purpose computer, a special purpose computer, a programmed microprocessor, a microcontroller and peripheral integrated circuit element(s), an ASIC, a digital signal processor, a hard-wired electronic or logic circuit and a programmable logic device.
28. A method of packet retransmission comprising:
   transmitting or receiving a plurality of packets;
   identifying at least one packet of the plurality of packets as a packet that should be retransmitted and at least one packet of the plurality of packets as a packet that should not be retransmitted.
29. The method of aspect 28, wherein the packet is any grouping of bytes.
30. The method of aspect 28, wherein the packet is one of an IP packet, an Ethernet packet, an ATM cell, a PTM packet, an ADSL Mux-Data Frame, a PTM-TC codeword, an RS codeword and a DMT symbol.
31. The method of aspect 28, wherein a bit field comprising a sequence identifier (SID) is appended to each packet.
32. The method of aspect 31, wherein the identifying step comprises using a special value for a sequence identifier (SID).
33. The method of aspect 31, wherein the appended bit field comprises a dedicated CRC.
34. The method of aspect 28, wherein at least one packet is stored for retransmission.
35. The method of aspect 28, wherein at least one packet is passed immediately to a high layer.
36. A packet handling method comprising:
   receiving a stream of packets;
   identifying a first number of packets in the stream of packets as low-latency packets;
   identifying a second number of packets in the stream of packets as low-error packets;
   forwarding the low-latency and low-error packets to a transceiver or a higher layer; and
   storing the low-error packets for error correction.
37. The method of aspect 36, further comprising appending the low-error packets with an identifier.
38. A method of allocating memory in a transceiver comprising:
   analyzing one or more communication parameters;
   identifying a memory allocation; and
   allocating memory based on the memory allocation to a retransmission function and one or more of interleaving, deinterleaving, RS coding and RS decoding.

39. A memory sharing method in a transceiver comprising:
receiving a memory allocation;
establishing a shared memory for one or more of interleaving, deinterleaving, RS coding, RS decoding and packet retransmission functions; and
sharing the shared memory between a retransmission function and one or more of interleaving, deinterleaving, RS coding and RS decoding functions.

40. The method of aspect 39, further comprising determining a compatibility of the memory allocation.

41. The method of aspect 39, wherein the compatibility of the memory allocation is based on channel performance metrics.

42. Means for performing the functionality of any of the aforementioned aspects.

43. An information storage media comprising information that when executed performs the functionality of any of the aforementioned aspects.

44. Any one or more of the features as substantially described herein.

45. Means for packet retransmission comprising:
means for transmitting or receiving a plurality of packets;
means for identifying at least one packet of the plurality of packets as a packet that should not be retransmitted.

46. The means of aspect 45, wherein the packet is any grouping of bytes.

47. The means of aspect 45, wherein the packet is one of an IP packet, an Ethernet packet, an ATM cell, a PTM packet, an ADSL Mux-Data Frame, a PTM-TC codeword, an RS codeword and a DMT symbol.

48. The means of aspect 45, wherein a bit field comprising a sequence identifier (SID) is appended to each packet.

49. The means of aspect 48, wherein the means for identifying comprises using a special value for a sequence identifier (SID).

50. The means of aspect 48, wherein the appended bit field comprises a dedicated CRC.

51. The means of aspect 45, wherein the at least one packet is not stored for retransmission.

52. The means of aspect 45, wherein the at least one packet is passed immediately to a high layer.

53. Means for sharing memory between an interleaving and/or deinterleaving function and a packet retransmission function.

54. Means for allocating a first portion of shared memory for retransmission and a second portion of the shared memory for interleaving and/or deinterleaving.

55. The means of aspect 54, further comprising means for transmitting or receiving a message indicating how to allocate the shared memory.

56. The means of aspect 54, further comprising means for transmitting or receiving a message indicating how to share the memory.

57. Means for sharing a memory between an interleaving and/or deinterleaving function and a packet retransmission function.

58. Means for packet retransmission comprising:
means for transmitting or receiving a plurality of packets;
means for identifying at least one packet of the plurality of packets as a packet that should be retransmitted and at least one packet of the plurality of packets as a packet that should not be retransmitted.

59. The means of aspect 58, wherein the packet is any grouping of bytes.

60. The means of aspect 58, wherein the packet is one of an IP packet, an Ethernet packet, an ATM cell, a PTM packet, an ADSL Mux-Data Frame, a PTM-TC codeword, an RS codeword and a DMT symbol.

61. The means of aspect 58, wherein a bit field comprising a sequence identifier (SID) is appended to each packet.

62. The means of aspect 61, wherein the means for identifying comprises using a special value for the sequence identifier (SID).

63. The means of aspect 58, wherein the appended bit field comprises a dedicated CRC.

64. The means of aspect 58, wherein at least one packet is stored for retransmission.

65. The means of aspect 58, wherein at least one packet is passed immediately to a high layer.

66. A packet handling means comprising:
means for receiving a stream of packets;
means for identifying a first number of packets in the stream of packets as low-latency packets;
means for identifying a second number of packets in the stream of packets as low-error packets;
means for forwarding the low-latency and low-error packets to a transceiver or higher layer; and
means for storing the low-error packets for error correction.

67. The means of aspect 66, further comprising means for appending the low-error packets with an identifier.

68. Means for allocating memory in a transceiver comprising:
means for analyzing one or more communication parameters;
means for identifying a memory allocation; and
means for allocating memory based on the memory allocation to a retransmission function and one or more of an interleaving, deinterleaving, RS coding and RS decoding function.

69. Means for memory sharing in a transceiver comprising:
means for receiving a memory allocation;
means for establishing a shared memory for one or more of interleaving, deinterleaving, RS coding, RS decoding and packet retransmission function; and
means for sharing the shared memory between a retransmission function and one or more of interleaving, deinterleaving, RS coding and RS decoding functionality.

70. The means of aspect 69, further comprising means for determining a compatibility of the memory allocation.

71. The means of aspect 69, wherein the compatibility of the memory allocation is based on channel performance metrics.

72. A transceiver capable of performing packet retransmission comprising:
a transmission management module configurable to transmit or receive a plurality of packets; and
a QOS module configurable to identify at least one packet of the plurality of packets as a packet that should not be retransmitted.

73. The transceiver of aspect 72, wherein the packet is any grouping of bytes.

74. The transceiver of aspect 72, wherein the packet is one of an IP packet, an Ethernet packet, an ATM cell, a PTM packet, an ADSL Mux-Data Frame, a PTM-TC codeword, an RS codeword and a DMT symbol.

75. The transceiver of aspect 72, wherein a bit field comprising a sequence identifier (SID) is appended to each packet.

76. The transceiver of aspect 75, wherein the QOS module uses a special value for a sequence identifier (SID).

77. The transceiver of aspect 75, wherein the appended bit field comprises a dedicated CRC.

78. The transceiver of aspect 72, wherein the at least one packet is not stored for retransmission.

79. The transceiver of aspect 72, wherein the at least one packet is passed immediately to a high layer.

80. A memory capable of being shared between interleaving and/or deinterleaving and packet retransmission.

81. A memory management module capable of allocating a first portion of shared memory for retransmission and capable of allocating a second portion of the shared memory to one or more of interleaving and deinterleaving functionality.

82. The module of aspect 81, further comprising a module for transmitting or receiving a message indicating how to allocate the shared memory.

83. The module of aspect 81, further comprising a module for transmitting or receiving a message indicating how to share the memory.

84. A module capable of being shared between interleaving and/or deinterleaving and packet retransmission.

85. A transceiver capable of performing packet retransmission comprising:
a transmission management module configurable to transmit or receive a plurality of packets; and
a QOS module configurable to identify at least one packet of the plurality of packets as a packet that should be retransmitted and at least one packet of the plurality of packets as a packet that should not be retransmitted.

86. The transceiver of aspect 85, wherein the packet is any grouping of bytes.

87. The transceiver of aspect 85, wherein the packet is one of an IP packet, an Ethernet packet, an ATM cell, a PTM packet, an ADSL Mux-Data Frame, a PTM-TC codeword, an RS codeword and a DMT symbol.

88. The transceiver of aspect 85, wherein a bit field comprising a sequence identifier (SID) is appended to each packet.

89. The transceiver of aspect 88, wherein the identifying step comprises using a special value for a sequence identifier (SID).

90. The transceiver of aspect 88, wherein the appended bit field comprises a dedicated CRC.

91. The transceiver of aspect 85, wherein at least one packet is stored for retransmission.

92. The transceiver of aspect 85, wherein at least one packet is passed immediately to a high layer.

93. A transceiver capable of handling a stream of packets comprising:
a QOS module capable of identifying a first number of packets in the stream of packets as low-latency packets and a second number of packets in the stream of packets as low-error packets;
a transmission management module capable of forwarding the low-latency and low-error packets to another transceiver; and
a buffer module capable of storing the low-error packets for error correction.

94. The transceiver of aspect 93, further comprising a packet QOS assignment module capable of appending the low-error packets with an identifier.

95. A transceiver capable of having an allocatable memory comprising:
a controller capable of analyzing one or more communication parameters; and
a memory management module capable of identifying a memory allocation and allocating a shared memory based on the memory allocation to a retransmission function and one or more of interleaving, deinterleaving, RS coding and RS decoding functions.

96. A transceiver capable of sharing memory comprising:
a controller capable of receiving a memory allocation; and
a memory management module capable of establishing a shared memory for a retransmission function and one or more of interleaving, deinterleaving, RS coding and RS decoding functions.

97. The transceiver aspect 96, wherein the memory management module further determines a compatibility of the memory allocation.

98. The transceiver of aspect 96, wherein the memory allocation is based on one or more communication channel performance metrics.

99. In a communication environment where packets are being transmitted, a method for allocating a first portion of shared memory for retransmission of packets and a second portion of the shared memory for interleaving and/or deinterleaving.

100. The method of aspect 99, wherein all errored packets are retransmitted.

101. The method of aspects 19, 20 and 99, wherein a retransmission function identifies packets that should not be retransmitted.

102. The method of aspect 99, wherein all packets are being transmitted without an assigned a QOS level.

103. A packet communication method comprising:
in a first mode of operation:
transmitting or receiving a plurality of packets;
identifying at least one packet of the plurality of packets as a packet that should not be retransmitted;
in a second mode of operation:
transmitting or receiving a plurality of packets;
allocating a first portion of shared memory for retransmission of packets and a second portion of the shared memory for one or more of interleaving, deinterleaving, coding, decoding and error correction; and
in a third mode of operation:
transmitting or receiving a plurality of packets;
identifying at least one packet of the plurality of packets as a retransmittable-type packet;
identifying at least one packet of the plurality of packets as a non-retransmittable-type packet;
allocating a first portion of shared memory for retransmission of the retransmittable-type packets and a second portion of the shared memory for one or more of interleaving, deinterleaving, coding, decoding and error correction.

104. The method of aspect 103, wherein the retransmittable-type packet is a low-latency packet.

105. The method of aspect 103, wherein the retransmittable-type packet is a low-error packet.

These and other features and advantages of this invention are described in, or are apparent from, the following detailed description of the exemplary embodiments.

BRIEF DESCRIPTION OF THE DRAWINGS

The exemplary embodiments of the invention will be described in detail, with reference to the following figures wherein.

DETAILED DESCRIPTION

Figure 1:
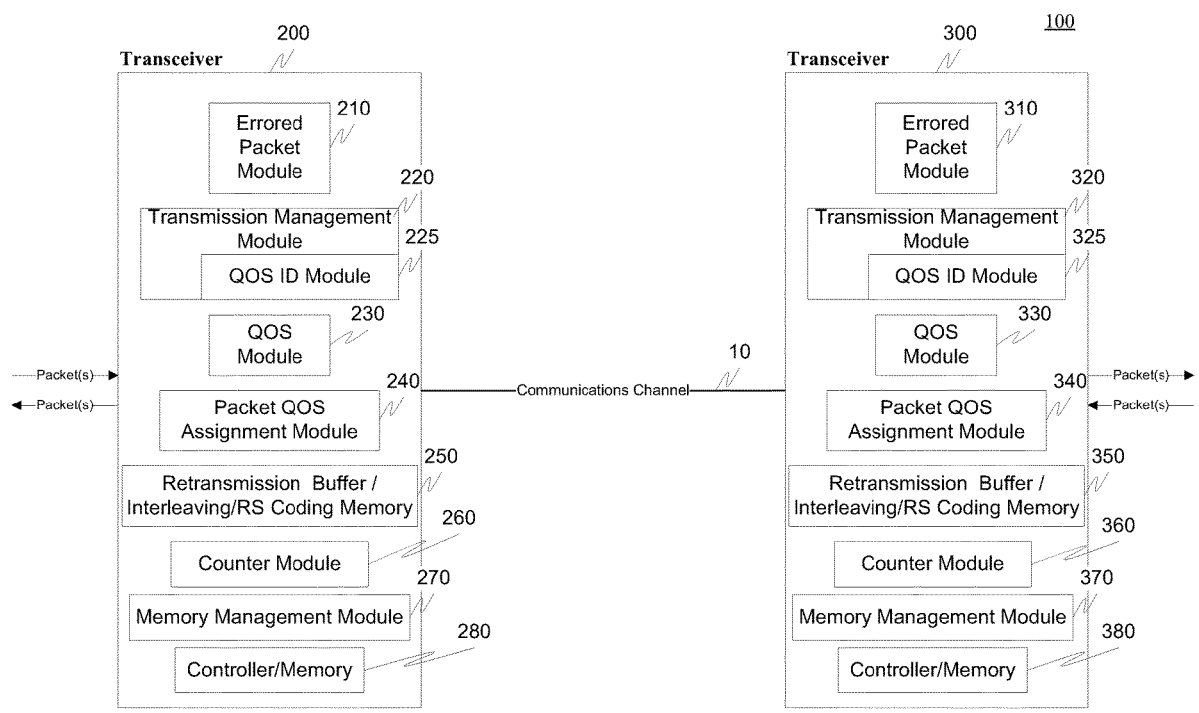
FIG. 1 illustrates an exemplary communication system according this invention.

The exemplary embodiments of this invention will be described in relation to packet retransmission and/or memory sharing in an xDSL environment. However, it should be appreciated, that in general, the systems and methods of this invention will work equally well for any type of communication system in any environment.

The exemplary systems and methods of this invention will also be described in relation to multicarrier modems, such as xDSL modems and VDSL modems, and associated communication hardware, software and communication channels. However, to avoid unnecessarily obscuring the present invention, the following description omits well-known structures and devices that may be shown in block diagram form or otherwise summarized.

For purposes of explanation, numerous details are set forth in order to provide a thorough understanding of the present invention. It should be appreciated however that the present invention may be practiced in a variety of ways beyond the specific details set forth herein.

Furthermore, while the exemplary embodiments illustrated herein show the various components of the system collocated, it is to be appreciated that the various components of the system can be located at distant portions of a distributed network, such as a communications network and/or the Internet, or within a dedicated secure, unsecured and/or encrypted system. Thus, it should be appreciated that the components of the system can be combined into one or more devices, such as a modem, or collocated on a particular node of a distributed network, such as a telecommunications network. As will be appreciated from the following description, and for reasons of computational efficiency, the components of the system can be arranged at any location within a distributed network without affecting the operation of the system. For example, the various components can be located in a Central Office modem (CO, ATU-C, VTU-O), a Customer Premises modem (CPE, ATU-R, VTU-R), an xDSL management device, or some combination thereof. Similarly, one or more functional portions of the system could be distributed between a modem and an associated computing device.

Furthermore, it should be appreciated that the various links, including communications channel 10, connecting the elements (not shown) can be wired or wireless links, or any combination thereof, or any other known or later developed element(s) that is capable of supplying and/or communicating data to and from the connected elements. The term module as used herein can refer to any known or later developed hardware, software, firmware, or combination thereof that is capable of performing the functionality associated with that element. The terms determine, calculate and compute, and variations thereof, as used herein are used interchangeably and include any type of methodology, process, mathematical operation or technique. Transmitting modem and Transmitting transceiver as well as Receiving modem and Receiving transceiver are used interchangeably herein.

Moreover, while some of the exemplary embodiments described herein are directed toward a transmitter portion of a transceiver performing interleaving and/or coding on transmitted information, it should be appreciated that a corresponding deinterleaving and/or decoding is performed by a receiving portion of a transceiver. Thus, while perhaps not specifically illustrated in every example, this disclosure is intended to include this corresponding functionality in both the same transceiver and/or another transceiver.

Communication system 100 comprises a portion of a transceiver 200 and a portion of a transceiver 300. The transceiver 200, in addition to well known componentry, comprises an errored packet module 210, a transmission management module 220, a QOS ID module 225, a QOS module 230, a packet QOS assignment module 240, a retransmission buffer/interleaving/deinterleaving/RS coding/RS Decoding memory 250, a counter module 260, a memory management module 270 and a controller/memory 280.

Connected via communication channel 10 to transceiver 200 is transceiver 300. The transceiver 300, in addition to well known componentry, comprises an errored packet module 310, a transmission management module 320, a QOS ID module 325, a QOS module 330, a packet QOS assignment module 340, a retransmission buffer/interleaving/deinterleaving/RS coding/RS Decoding memory 350, a counter module 360, a memory management module 370 and a controller/memory 380.

As discussed above, the systems, methods and protocols discussed herein will be described in relation to xDSL systems, such as those specified in ADSL2 ITU-T G.992.3, ADSL2+ITU G.992.5, and VDSL2 ITU G.993.2, which are incorporated herein by reference in their entirety.

In operation, a first aspect of the invention relates to retransmission of one or more packets, the retransmission identifier being implemented at any transmission layer where packet boundaries are defined. For example, it can be implemented in the Packet Transmission Mode TC (PTM-TC) of xDSL systems. For reference, "Annex A" which is of record in the identified provisional filing and incorporated by reference herein contains the PTM-TC of ADSL2 and VDSL2 systems as specified in the ITU-T G.992.3 ADSL2 standard.

As discussed herein, the invention will generally be described in relation to the retransmission mechanism being incorporated as part of the PTM-TC however, it should be appreciated that it can also be implemented inside other layer(s) of a communication device, such as an xDSL transceiver, such as within the PMD or PMS-TC.

The retransmission techniques disclosed herein can also be performed at a layer above the PTM-TC, for example, in a new layer between the PTM-TC and the next higher layer, or at any layer above the physical layer, e.g., layers 2, 3, 4, 5, etc.

Additionally, while "packet" is used herein, the term "packet" includes any basic data unit, i.e., a grouping of bytes. For example, a packet could be an IP packet, an Ethernet packet, an ATM cell, a PTM packet, an ADSL Mux-Data frame, a PTM-TC codeword, an RS Codeword, a DMT symbol, or, in general, any grouping of data bytes or information. A packet could also be a combination of one or more of the above. For example, a packet could be constructed by concatenating any number of ATM cells to create a larger grouping of bits. For example, five 53-byte ATM cells could be combined into a 265 byte packet or four 65 PTM-TC codewords could be combined into a 260 byte packet. A packet could also be based on dividing any of the above groupings of bytes. For example, larger IP or Ethernet packets could be divided into smaller groups of bytes to be used as a "packet" with the retransmission functionality described herein. For example, a 1500 byte IP packet could be divided into three 500 byte packets and used by the retransmission protocol. If the retransmission function is implemented as part of the PTM-TC, packets are received from a higher-layer in the xDSL transmitter PTM-TC and sent via the xDSL transmitter PMS-TC and PMD over the communication channel to the xDSL receiver. The xDSL receiver PMD and PMS-TC process the received signal and pass the results to the PTM-TC, which processes the information and passes the received packet up to a higher layer(s).

Packets received from the higher layer at the xDSL transmitter PTM-TC can be designated to have a QOS level. The QOS level of a packet can indicate the importance of certain service metrics (or characteristics) of this (or more) packet(s). Two exemplary QOS metrics are delay (or latency) and PER. Although, as discussed above, these two characteristics are the focus of the invention, any number of different QOS metrics could also be used.

As an example, in the case where the 2 QOS metrics are latency and PER, a first set of packets carrying certain information may have a requirement for very low PER but may be able to tolerate higher delay. Other packets containing information such as voice or data traffic may have very low delay requirements but can tolerate a higher PER. According to an exemplary embodiment of this invention, the first set of packets would be designated as "low-PER" QOS packets whereas voice or data packets would be designated at "low-latency" QOS packets. The QOS level (or metric) of a packet could be designated in a number of ways. For example:

i) Certain bit fields in the header of data portions of each packet could contain certain values that specify the QOS requirements a packet. For example, the packet header could contain bit fields that indicate if the packet has a "low-PER" QOS requirement or a "low-latency" QOS requirement. These fields could be read by the transmitting modem and/or receiving modem to determine the QOS level of each packet.

ii) When sending packets from higher layer to the PTM-TC, the higher layer could indicate on a packet by packet basis the QOS requirements of each packet. For example, there could be a separate signal on the interface that indicates if a packet being transferred has a "low-PER" QOS requirement or a "low-latency" QOS requirement.

iii) When sending packets from higher layer to the PTM-TC, there could be a separate interface (or channel) for packets with different QOS requirements. For example, one channel could be used to transfer packets that have a "low-PER" QOS requirement and a second channel could used to transfer packets that have a "low-latency" QOS requirement. This general concept could also be scaled to accommodate a plurality of different QOS requirements and a plurality of channels.

iv) As in the case of Pre-Emption in the PTM-TC (see Annex A), two logically separated y-interfaces could be used for the transport of a low-PER and low-latency packet flow through a single bearer channel. This general idea could then be scaled to support any number of packet types.

Other mechanisms can also be used to designate the QOS level of a packet—provided the transmitter and/or receiver retransmission protocol is capable of knowing the QOS level for one or more packets.

Once the QOS level is known by the PTM-TCs, an efficient packet retransmission can be designed. The exemplary packet retransmission methods and protocols can be designed to include any one or more of the following system level characteristics:

All packets are received from the higher layer and passed to the higher layers in the correct order.

"Low-latency" QOS packets will not incur any extra delay due to retransmission.

Only packets with "low-PER" QOS should be retransmitted, and therefore only low-PER packets will incur the extra delay due to the retransmission mechanism.

Flow control can be minimized such that the transmitter can generally accept all packets from the higher layer at the required data rate without holding-off (or "blocking") packets from the higher layer during the retransmission process.

Packet delay-variation/jitter can be minimal.

A "DRR-like" functionality in a single bearer without requiring latency/interleaver OLR.

The transceiver 200, in cooperation with the QOS module 230, receives packets from a higher-layer. In cooperation with the packet QOS assignment module 240, a packet Sequence ID (SID) is appended to the received packets. The packets, in cooperation with the transmission management module 220, can then be transmitted in the order in which they were received.

The QOS Module 230, if not already performed by a high layer, also identifies packets based on the QOS requirement of the packet(s). Then, in cooperation with the packet QOS assignment module 240, a QOS identifier is associated with the packet as discussed hereinafter.

If, for example, the packet is identified as a low-PER packet, and assigned such an identifier by the QOS module 230, when the transmission management module 220 receives the packet, the packet is identified by the QOS ID module 225 as being a low-PER packet and the packet is forwarded for storage in the retransmission buffer 250. Alternatively, if the packet has been labeled as a low-latency packet, and identified as such by the by the QOS ID module 225, the packet can be transmitted to the receiving modem in cooperation with the transmission management module 220.

The low-PER packets can be stored for a sufficient amount of time to wait for a retransmission message from the receiver PTM-TC. During this time, the transmitting modem can continue to receive packets from one or more higher layers, label these packets, if needed, and store these packets, if they are identified as low-PER packets, in the same way. The resulting minimum storage requirements for the transmitter PTM-TC are estimated below.

For successful retransmission, the receiving modem should be able to inform the transmitting modem which packet, or packets, need to be retransmitted. One exemplary way of performing this is by transmitting packets with an appended bit field that contains a counter indicating the place of each packet in a stream of packets. This counter value is also known as a Sequence ID (SID). For example, a bit field containing a 16-bit counter could be appended to each packet and the counter module 260 would be incremented by one after each packet was transmitted. In cooperation with the packet assignment module 240, a packet counter field could be appended to the packet in a number of places, for example, at the beginning or end of the packet, or at the beginning or end of the packet header.

Packets received from a higher-layer may already have information in a header or data field of the packet that contains the packet count, or sequence, information. In addition, the packet counter field may be appended with an additional CRC field that contains a cyclic redundancy check that is computed on the packet counter field bits only. This CRC can be used by the receiver to determine if the packet counter field is received correctly, i.e., without bit errors. This CRC can be in addition to the standard CRC inserted by the standard PTM-TC (the standard packet PTM-TC CRC is a CRC that covers all bits in a packet). The standard packet CRC may also cover the new packet counter field in its CRC as well. This helps if the receiving modem uses the presence or absence of the packet counter field in a packet to detect if the packet has a low-PER or low-latency requirement (discussed below).

Alternatively, or in addition, the packet counter field (with or without a dedicated CRC) can be appended only to the packets with a specific QOS requirement, whereas all other packets can be transmitted without modification. For example, all video packets with low-PER QOS could contain the appended packet counter field whereas all the voice/data low-latency packets could be transmitted unchanged. One exemplary benefit of this is that the overhead (rate loss) due to adding the packet counter field is incurred only when transmitting low-PER packets.

Alternatively, or in addition, all low-PER and low-latency packets can be transmitted with the low packet counter field (with or without a dedicated CRC). In this case, the packet counter field of the low-latency packets may contain a special value indicating that a packet is not a low-PER packet. Also, the packet counter field of the low-latency packet may not even contain a count value, since the low-latency packets are not intended to be retransmitted. In this case, the packet counter field could contain a counter value only for low-PER packets and the counter value would only be incremented when a low-PER packet was transmitted. As an example, if the packet counter field is 16 bits, the special value of all zeros could be used to indicate that a packet is a low-latency packet. In this case, low-PER packets could contain counter values from one up to $2^{16}-1$, but not including all zeros, since this special zero value can be used to indicate a low-latency packet.

The receiving modem, e.g., receiver PTM-TC, which in this case is illustrated as the transceiver 300 and includes comparable functionality to that described in relation to transceiver 200, receives packets from the transmitting modem via the PMS-TC. If the received packet is identified as a low-latency packet by the QOS ID module 325, the packet is passed to a higher-layer. If a received packet is identified by the QOS ID module 325 as a low-PER packet, the packet is forwarded, with the cooperation of the transmission management module 320, to the retransmission buffer 350 for a minimum amount of time before passing to a higher-layer.

The storage time in the retransmission buffer 350 helps ensure that the retransmission protocol provides a constant delay, e.g., no delay variation seen by the upper layers. This way, if a packet needs to be retransmitted, the receiving modem can continue to provide packets to the higher-layers at a constant rate while waiting for the retransmitted packet(s) to arrive from the transmitting modem. The resulting minimum memory (or storage) requirements for the receiving PTM-TC are estimated below.

Alternatively, low-PER packets without errors may not be stored for a minimum amount of time before passing to a higher-layer. The error-free low-PER packets can be passed to the higher-layer immediately just like the low-latency packets. However, when a low-PER packet is in error, it is stored along with all of the following low-PER packets before passing to a higher-layer in order to wait for the retransmitted packet(s) to arrive. This will cause a delay variation on the low-PER packets whenever a retransmission occurs. However, this delay variation would not apply to the low-latency packets.

The QOS ID module 325 can detect that a packet is either low-PER or low-latency using several different methods. For example, if all low-PER and low-latency packets contain the appended packet counter field, then the receiving modem, in cooperation with the counter module 360, detects a low-latency packet when a packet counter field contains the designated special value, which was inserted by the transmitting modem, indicating the packet is a low-latency packet.

Alternatively, or in addition, the receiver could detect a low-PER packet when the packet counter field contains a valid packet counter value. Additionally, if a dedicated CRC is appended to the packet counter field, the CRC could be used to detect if the packet counter field bits are in error.

If the packet counter field, including the CRC, is only appended to low-PER packets, the absence or presence of this field in a packet can be used by the receiving modem, and in particular the QOS ID module, to detect a low-delay packet. For example, the receiving modem can examine the position in the packet where the packet counter field would be, if it was a low-PER packet, and if the packet counter field CRC fails while the standard whole packet CRC is correct, the receiving modem could determine that the packet is a low-delay packet, since it does not contain the packet counter field. Likewise, for example, the receiving modem can examine the position in the packet were the packet counter field would be, if it was a low-PER packet, and if the packet counter field CRC is correct, the receiving modem would determine that the packet is a low-PER packet, regardless of the status of the standard whole packet CRC.

The receiving modem, in cooperation with the retransmission buffer 350, and the errored packet module 310, can be used to detect missing or errored packets in a number of exemplary ways. For example, the errored packet module 310 can detect bit errors in the packet using the standard/whole packet PTM-TC CRC. Alternatively, or in addition, the errored packet module 310 can detect bit errors in the packet counter field if the transmitting modem appended a dedicated CRC to the packet counter field. This CRC is valuable because it can be used by the errored packet module in the receiving modem to determine if a packet has the correct packet number, even if the standard whole packet CRC happens to be in error.

Alternatively, or in addition, the errored packet module 310, can detect an errored or missing packet by receiving a packet with a correct CRC, either in the standard or packet counter field, which contains a packet counter number that is not the expected packet counter number. For example, if the errored packet module 310, in cooperation with the counter module 360, detects the receipt of a packet with a counter number equal to 5, wherein the errored packet module 310 is expecting to receive a packet with a counter equal to 3, the errored packet module 310 can determine that two packets, namely packets numbered 3 and 4, were lost due to errors.

Once a packet(s) is found to be in error, there are several exemplary ways in which a receiving modem can communicate information to the transmitting modem indicating that a retransmission of one or more packets is required. For example, the receiving modem, in cooperation with the errored packet module 310, can send an acknowledgment (ACK) message to the transmitting modem for every correctly received message or every predetermined number of packets. As long as the transmitting modem, and in particular the errored packet module 210, receives messages acknowledging receipt of packets in sequential order, there is no need for retransmission of information to the receiving modem. However, if the transmitting modem, and in particular the errored packet module 210, receives a message from the receiving modem, and in particular the errored packet module 310, indicating that a packet was correctly received with a counter value that is out of order, a retransmission by the transmitting modem is required. In the above example, where the receiving modem received a packet with a counter value equal to 5, without receiving packets numbered 3 and 4, the transmitting modem could receive an ACK for the packet with counter value of 2 and then an ACK for the packet with a counter value of 5. The transmitting modem would then determine that it was necessary to retransmit packets with counter values of 3 and 4 since they were not received.

Alternatively, or in addition, a timeout value could be specified for the transmitting modem. This timeout value could correspond to the amount of time that the transmitting modem should wait for an ACK for particular packet before retransmitting the packet. The timeout value could be set to be at least as long as the round-trip delay required for the transmitting modem to send a packet to the receiving modem and for the receiving modem to send an ACK back to the transmitting modem. If an ACK is not received by the timeout value, the transmitting modem could retransmit the packet.

Alternatively, or in addition, a negative acknowledgment (NAK) could be sent to the transmitting modem when a packet is detected as errored or missing. In the above example, when the receiving modem received the packet with a counter value of 5, while expecting a counter value of 3, the receiving modem could send a NAK message to the transmitting modem indicating that packets with counter values of 3 and 4 were not correctly received and needed to be retransmitted.

Alternatively, or in addition, if a packet was received with a correct packet counter CRC and a valid packet counter value a and an incorrect standard whole packet CRC, the receiving modem could send a NAK message to the transmitting modem indicating that a packet with a value of a was incorrectly received and needed to be retransmitted.

Assuming that errored packets are infrequent, any methodology that sends an ACK for each correctly received packet can require a larger amount of data rate in the message channel that communicates this information back to the transmitting modem. In this case, sending only NAKs has the benefit that it requires sending a message only when an errored or missing packet is detected. Depending on the data rate capabilities of the message channel, and the PER, a retransmission system may use only ACKs, only NAKs, or both ACKs and NAKs at the same time.

The ACK and NAK messages sent back to the transmitting modem can be transmitted over the same physical channel i.e., phone line, in the opposite direction as the received packets. Since the channel has a limited data rate and is not necessarily error-free, it is important to make sure that these messages are as robust as possible and consume the least amount of data rate. Additionally, since the transmit and receive retransmission memory requirements depend on the round-trip latency of the connection, is important to minimize latency requirements for the message channel. There are several ways these requirements can be addressed.

The messages can be sent over a separate "low-latency" or "fast" path between the xDSL transceivers. This fast path could include little or even no delay due to interleaving and can be specified to have a latency that is less than 2 ms.

Alternatively, or in addition, the messages can be sent with increasing robustness by repeating transmission of each message a number of times. For example, the message could be repeated x times in order to make sure that even if x−1 messages were corrupted by the channel, at least one message would be received correctly.

Alternatively, or in addition, the messages can be sent such that each message is repeated a number of times and each repeated message is sent in a different DMT symbol. For example, the message can be repeated x times and each message sent in one of x DMT symbols. This way, even if x−1 DMT symbols were corrupted by the channel, at least one message would be received correctly.

Alternatively, or in addition, the messages can be sent such that each message is repeated a number of times and each repeated message is sent in different DMT symbols. For example, the message could be repeated x times and each message sent in one of x DMT symbols. This way, even if x−1 DMT symbols were corrupted by the channel, at least one message would be received correctly.

Alternatively, or in addition, the messages can be sent such that each message is repeated a number of times and each repeated message is sent a plurality of times in each DMT symbol. For example, the message could be repeated x times and each repeated message sent y times in one of x DMT symbols. This way, even if x−1 DMT symbols were corrupted by the channel and/or large portions of a DMT symbol were corrupted by a channel, the least one message would be received correctly.

Alternatively, or in addition, the messages can include multiple packet count values in order to reduce the data rate requirements. For example, if packets with counter values of 3-9 are correctly (or incorrectly) received an ACK (or NAK) message would be sent to indicate these packet values. For example, the message could contain the values 3 and 9 and the receiver of the message would automatically know that all intermediate values (4, 5, 6, 7, 8) are also been indicated in the message.

Alternatively, or in addition, the DMT sub-carriers that modulate these messages could operate with a much higher SNR margin e.g., 15 dB, as compared to the normal 6 dB margin of xDSL systems. This way, the messages would have a higher immunity to channel noise.

Alternatively, or in addition, a receiving modem may need to send an additional ACK or NAK message after already in the process of sending a repeated message. For example, a receiving modem may detect that packets with values 3 to 9 have been correctly received and send an ACK message back to the transmitting modem indicating this information. This message can be repeated x times with each repeated message being transmitted (at least once) on different DMT symbols. While sending the second repeated message on the second DMT symbol, the receiver could detect that packets with values 10 to 17 have now also been correctly received. In this case, the receiving modem could just append this information to the previous message or, alternatively, send a new separate message that is repeated as well x times with each repeated message being transmitted (at least once) on a different DMT symbol.

Alternatively, or in addition, when repeating a message x times on x DMT symbols, each repeated message can be modulated on a different set of DMT sub-carriers on each DMT symbol. This way, if one or more sub-carriers have a low SNR, the message will still be correctly received.

For low-PER packets, the delay due to this retransmission protocol is equal to the delay that results from storing these packets at the receiving modem (RX PTM-TC) to pass in the packets to a higher layer. Low-latency packets do not incur extra delay.

The transmitting modem must store a packet for retransmission for a time equal to the round trip delay from when the packet is sent to when the retransmission message is received. During this time the transmitting modem continues to receive packets from the higher layer and continues to store these packets in the same way. Therefore the storage requirements in octets can be computed as:

Minimum TX memory (octets)=roundtripdelay*datarate, where the roundtripdelay is the time equal to the round trip delay from when the packet is sent to when the retransmission message is received, and the datarate is the data rate of the connection that is transferring the packets. For ITU-T G.993.2 VDSL2, which is incorporated herein by reference, this can be computed using the VDSL2 profile parameters as:

Minimum TX memory(octets)=(DS+US Interleaving Delay in octets)+(US+DS alpha/beta delay without interleaving)*(Bidirectional Net data rate)=MAXDLEYOCTET+(4 ms)*MBDC, where MAXDELAYOCTET and MBDC are as specified in the VDSL2 profiles.

For the receiver, the minimum receiver storage requirements can be determined in a similar manner. More specifically, the RX PTM-TC must store a packet before passing it to the higher layer for a time equal to the round trip delay from when a retransmission message is transmitted to when the retransmitted packet is received. This is equal to storage requirements in octets (same as transmitter):

Minimum RX memory (octets)=roundtripdelay*datarate, where the roundtripdelay is the time equal to the round trip from when a retransmission message is transmitted to when the retransmitted packet is received and the datarate is the data rate of the connection that is transferring the packets.

For ITU-T G.993.2 VDSL2 this can be computed using the VDSL2 profile parameters as:

Minimum RX memory(octets)=(DS+US Interleaving Delay in octets)+(US+DS alpha/beta delay without interleaving)*(Bidirectional Net data rate)=MAXDLEYOCTET+(4 ms)*MBDC, where MAXDELAYOCTET and MBDC are as specified in the ITU-T G.993.2 VDSL2 profiles.

TABLE 1

| Minimum TX or RX memory requirements for VDSL2 | | | | |
|---|---|---|---|---|
| VDSL2 PROFILE | 8a, 8b, 8c, 8d | 12a, 12b | 17a | 30a |
| TX or RX memory requirements (octets) = MAXDLEYOCTET + .002MBDC | 90,536 | 99,536 | 123,304 | 231,072 |

The estimates in Table 1 assume that all the entire MAXDELAYOCTET and MBDC are used for the transfer of the packet stream, i.e., the reverse channel has a very low data rate and no interleaving.

Some xDSL standards specify minimum storage, i.e., memory, requirements for interleaving of RS codewords. Interleaving with RS coding is an effective way of correcting channel errors due to, for example, impulse noise. For example, VDSL2 requires support of an aggregate bidirectional interleaver and de-interleaver memory of 65 Kbytes for the 8a VDSL2 profile. This corresponds to storage requirement of approximately 32 Kbytes in a single transceiver.

Sharing of Memory Between the Retransmission Function and One or More of the Interleaving/Deinterleaving/RS Coding/RS Decoding Functions From Table 1, it is apparent that the memory requirements to support the retransmission protocol may be more than double the storage requirements of a single transceiver. Additionally, the retransmission protocol provides a different method for correcting channel errors due to, for example, impulse noise.

Moreover, interleaving and RS coding methods and retransmission protocols provide different advantages with respect to error correction capabilities, latency, buffering requirements, and the like. For example, under certain configuration and noise conditions the interleaving/RS coding provides error correction/coding gain with less delay and overhead than the retransmission protocol (for packets that can be retransmitted). While under other conditions the retransmission protocol will provide better error correction with less delay and overhead than the interleaving/RS coding.

In some cases, a first portion of the memory can be used for one function and a second portion of the memory for some other function. For example, if the configuration and noise conditions are such that the interleaving/RS coding would not provide good error correction/coding gain, then all the available memory could be used for the retransmission function and none allocated to the interleaving/deinterleaving/RS coding/RS decoding functionality, e.g., the interleaving/deinterleaving could be disabled.

Likewise, if the configuration and noise conditions are such that the retransmission protocol would not provide good error correction/coding gain, then all the available memory could be used for the interleaving/deinterleaving/RS coding/RS decoding functionality and no memory would be used for the retransmission function, e.g., the retransmission function would be disabled.

Alternatively, or addition, both methods could be used because both have their advantages, with the system, e.g., the memory management module 370, being able to dynamically allocate a first portion of the memory 250/350 to the interleaving/deinterleaving/RS coding/RS decoding functionality and a second portion of the memory to the retransmission functionality. For example, 40% of the memory could be allocated to the interleaving/deinterleaving/RS coding/RS decoding functionality with the remaining 60% allocated to the retransmission of functionality. However, it should be appreciated, that in general, the memory can be divided, i.e., shared, in any manner.

The sharing of memory between the retransmission function and the interleaving/deinterleaving/RS coding/RS decoding functions is not restricted to retransmission protocols described in other embodiments that utilize QOS metrics to determine which packets should be retransmitted. In other words, the sharing of memory between the retransmission function and the interleaving/deinterleaving/RS coding/RS decoding functions can be utilized for retransmission systems where all errored packets are retransmitted, i.e., there is no QOS identifier in the retransmission protocol. For example, the FEC/interleaving could be used to meet the INPmin requirement specifically targeting the impulse noise that occurs frequently (e.g., on the order of minutes or seconds) but is short in duration and can therefore be corrected by the FEC/interleaving. For example, the retransmission protocol can be used to correct infrequent errors (on the order of hours) that are long in duration and would not be correctable by the FEC/interleaving. As another example, the FEC/interleaving function may be used in combination with the retransmission function because it is well known that FEC with minimal interleaving provides a 1 dB to 3 dB coding gain when used with a trellis code (as is often the case in xDSL systems). This means that even when the majority of the shared memory is allocated to a retransmission function to address channel noise (such as impulse noise), a smaller amount of memory may be allocated to the FEC/interleaving function for the coding gain advantage.

Associated with the ability to allocate or partition memory between one or more of the interleaving/deinterleaving/RS coding/RS decoding functionality and retransmission functionality, is the ability to exchange information between transceivers on how to establish this allocation. For example, the transmitting modem may send a message to the receiving modem indicating how much of the available memory is to be allocated to one or more of the interleaving/deinterleaving/RS coding/RS decoding functionality and how much memory is to be allocated to the retransmission functionality. For example, if the receiving modem contains 100 kBytes of available memory, the transmitting modem could send a message to the receiving modem indicating that 25 kBytes should be allocated to RS coding functionality and 75 kBytes should be allocated to the retransmission functionality. Since the receiving modem generally determines the interleaving/RS coding parameters that are used, the receiving modem could use this information to select parameters, e.g., interleaver depth and codeword size, that would result in an interleaving memory requirement that is no more than the amount indicated in the message.

Alternatively, or addition, the receiving modem can send a message to the transmitting modem indicating how much of the available memory is to be allocated to one or more of the interleaving/deinterleaving/RS coding/RS decoding functionality, and how much memory should be allocated to the retransmission functionality.

Sharing of Memory Between a Retransmission Function with Identification of Low-PER and/or Low-Latency Packets and One or More of Interleaving/Deinterleaving/RS Coding/RS Decoding Functions.

A way of reducing the total memory requirement of a transceiver that supports the retransmission functionality with the identification of the low-PER and/or the low-latency packets is to define a limit, such as a maximum value, for the data rate of the low-PER packet stream, i.e., the packets requiring retransmission to meet a specific PER requirement. For example, if the total date rate is 50 Mbps, and the roundtrip delay is 10 ms, the minimum TX or RX memory requirement is 50,000,000*0.01/8=62500 bytes if the retransmission function must support the case where all the transmitted packet (all 50 Mbps) are low-PER packets. If however, only a portion of the 50 Mbps data rate is allocated to the low-PER packet stream (e.g. 30 Mbps), whereas the remainder of the data rate is allocated to the low-latency packet stream (e.g. 20 Mbps), the minimum TX or RX memory requirement would be 30,000,000*0.01/8=37500 bytes (assuming a roundtrip delay of 10 ms). In this case, the transmitting modem (or receiving modem) may send a message to the receiving modem (or transmitting modem) that indicates the maximum data rate of the packet traffic that will be used in the retransmission function. Using the example above, the transmitting modem (or receiving modem) would send a message indicating that the low-PER traffic will not exceed 30 Mbps, in which case the receiving modem (or transmitting modem) will allocate memory to the retransmission functionality and the interleaving/RS coding (or deinterleaving/RS decoding) functionality accordingly.

One exemplary advantage of indicating the low-PER and low-latency packets as part of the retransmission protocol is that it provides a DDR-like functionality without the overhead of dynamically re-allocating latency paths. For example, when a video application is turned off (less low-PER packets on the connection), the data application data rate can be increased (more low-latency packets on the connection) without any changes in the transmission parameters.

The retransmission protocol can also be used with or without underlying FEC/interleaving (or deinterleaving). An exemplary approach is to use the FEC/interleaving to meet the INPmin requirement specifically targeting the impulse noise that occurs frequently, e.g., on the order of minutes or seconds. The retransmission protocol can be used to correct infrequent errors (on the order of hours) that will only typically be a problem for very-low PER applications, such as video.

When a retransmission protocol is combined with underlying FEC/interleaving (or deinterleaving), the retransmission protocol latency will grow in proportion to the additional FEC/interleaving delay. This is due to the fact that the required receiver buffering corresponds approximately to the round-trip delay time of packet transmission and message acknowledgment.

As an example of utilizing the retransmission protocol that identifies one or more of low-PER and low-latency packets with underlying FEC/Interleaving (or deinterleaving), the FEC/interleaving is used to achieve the INPmin requirements within the latency constraint and the retransmission function is used to provide another layer of error correction. The low-PER packets are passed through both the retransmission function and the FEC/interleaver and, as a result, a very low PER is achieved. The low-latency packets are passed through the FEC/Interleaver but not passed through the retransmission function. Since low-latency packets are passed through the FEC/interleaver, they will meet the INPmin and MaxDelay requirements without incurring the extra delay from the retransmission protocol.

Example Configuration Parameters:
DS Data rate=25 Mbps, INPmin=2, MaxDelayDS=8 ms
Example FEC/Interleaving Parameters:
NFEC=128, R=16 which results in an interleaver memory of approximately 14 Kbytes for INP=2 with 8 ms of delay.
Retransmission Protocol:
If we assume the US latency is 2 ms, the retransmission protocol will add a minimum of 8+2=10 ms of latency. This means that the total DS latency (FEC/interleaving+Retransmission) will be approximately 8+10=18 ms.
Memory Requirements:
The memory requirements for the retransmission protocol can be calculated as: (10 ms)×(25 Mbps)/8=31 Kbytes. Therefore the transmitter and receiver will both need a total memory of (31+14)=45 Kbytes for the retransmission protocol and FEC/Interleaving function.
Low-PER Packets:
Latency=18 ms. The PER is very low because INPmin=2 (from FEC/interleaving) is combined with the error correction of the retransmission function.

Low-Latency Packets:
Latency=8 ms. INP=2 from FEC/interleaving. No additional delay due to retransmission function.

Although this invention describes the retransmission being done as part of the PTM-TC, it could also be done inside other layer(s) of the xDSL transceiver, such as the PMD or the PMS-TC. Alternatively, it could performed at a layer(s) above the PTM-TC, for example, in a new layer between the PTM-TC and the next higher layer, or in general any layer above the physical layer, e.g., layer 1, 2, 3, 4 or 5.

In this invention, the term "transmitter" generally refers to the transceiver that transmits the packets. Likewise the term "receiver" generally refers to the transceiver that receives the packets. Therefore the "transmitter" also receives the ACK/NAK messages and the "receiver" also transmits the ACK/NAK messages.

Figures 2, 3:
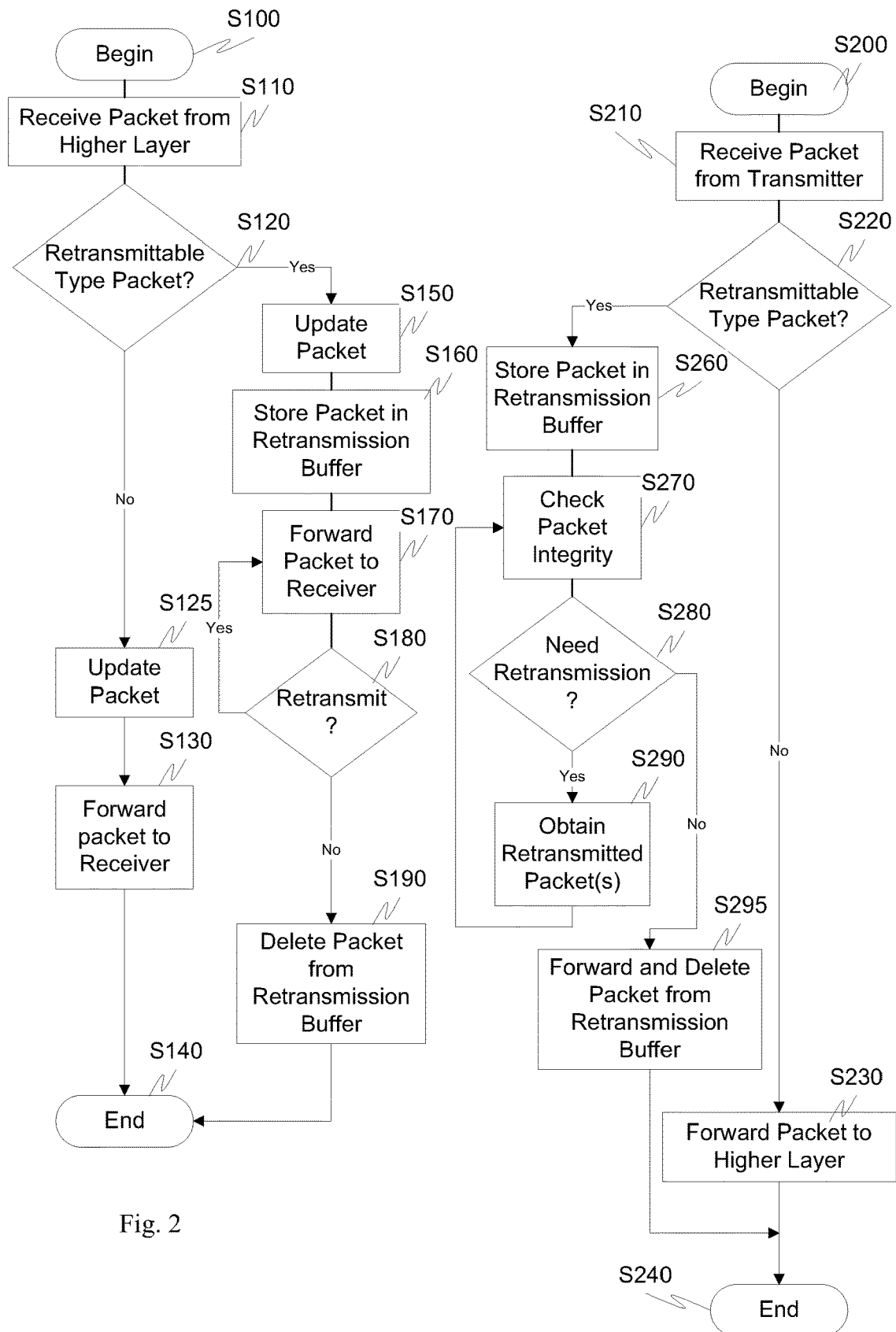
FIG. 2 is a flowchart outlining an exemplary method for packet retransmission according this invention.
FIG. 3 is a flowchart outlining an exemplary method for retransmitted packet reception according this invention.

FIG. 2 outlines an exemplary method of operation of a transmitting modem utilizing the retransmission protocol. In particular, control begins in step S100 and continues to step S110. In step S110, a packet is received from a higher layer. Then, in step S120, a decision is made as to whether the received packet is a retransmitted type packet. If the packet is not a retransmitted type packet, such as a low-latency packet, control jumps to step S125 where the packet is optionally updated (as discussed above) with control continuing to step S130 where the packet is forwarded to the receiver. Control then continues to step S140 where the control sequence ends.

If the packet is a retransmitted type packet, such as a low-PER packet, control continues to step S150. In step S150, the packet can be updated with information such as a sequence identifier or other information that allows a receiver to be able to determine which packet (or packets) need to be retransmitted. Next, in step S160, the updated packet is stored in the retransmission buffer. Then, in step S170, the packet is forwarded to the receiver. Control then continues to step S180.

In step S180, a determination is made whether the packet needs to be retransmitted. If the packet needs to be retransmitted, control jumps back to step S170. Otherwise, control continues to step S190.

In step S190, the packet is deleted from the retransmission buffer. Control then continues to step S140 where the control sequence ends.

FIG. 3 outlines an exemplary method of operation of a receiving modem utilizing the retransmission protocol. In particular, control begins in step S200 and continues to step S210. In step S210, a packet is received from the transmitter. Next, in step S220, a determination is made whether the packet has been identified as a retransmitted type packet. If the packet has not been identified as a retransmittable type packet, control jumps to step S230.

In step S230, the packet is forwarded to a higher layer. Control then continues to step S240 where the control sequence ends.

Alternatively, if the received packet is a retransmittable type packet, the packet is stored in the retransmission buffer in step S260. Next, in step S270, the integrity of the packet can be checked, for example utilizing a CRC. Then, in step S280, a determination is made whether the packet needs retransmission. If the packet needs retransmission, control continues to step S290 where the retransmitted packet is obtained, for example, based on the sending of a message(s), one or the other transceiver determining a packet is missing, or the like, as discussed above, with control continuing back to step S270 for an integrity check.

If the packet does not need retransmission, control continues to step S295 where the packet is forwarded to a higher layer and deleted from the retransmission buffer. Control then continues to step S240 where the control sequence ends.

Figure 4:
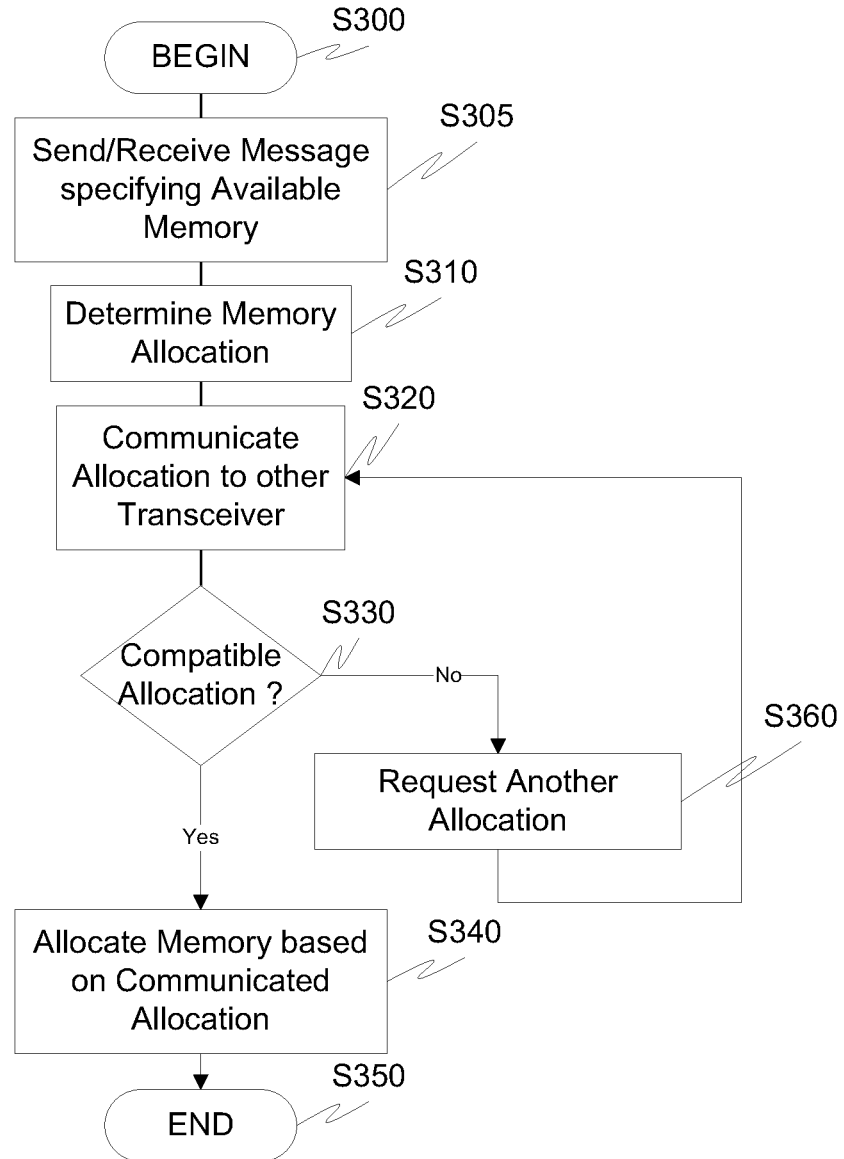
FIG. 4 is a flowchart outlining an exemplary method for memory allocation according to this invention.

FIG. 4 outlines an exemplary memory allocation method for sharing memory between the retransmission function and one or more of the interleaving/deinterleaving functionality and coding functionality. In particular, control begins in step S300 and continues to step S305. In step S305, a message is sent/received specifying the available memory. Typically, the receiver will send a message to the transmitter specifying the available memory, but the transmitter could also send a message to the receiver. Next, in step S310, a determination is made as to how the memory should be allocated. As discussed, this allocation can be based on one or more of error correction capability, latency, buffering requirements, SNR, impulse noise, or in general, any communication parameter. Next, in step S320, the memory allocation is communicated to another transceiver. Then, in step S330, a determination can made as to whether the allocation is compatible. If the received allocation is not compatible, control continues to step S360 wherein another allocation can be requested, with control continuing back to step S320.

Alternatively, if the allocation is compatible, in step S340 the memory is allocated based on the received allocation. Control then continues to step S350 where the control sequence ends.

Figure 5:
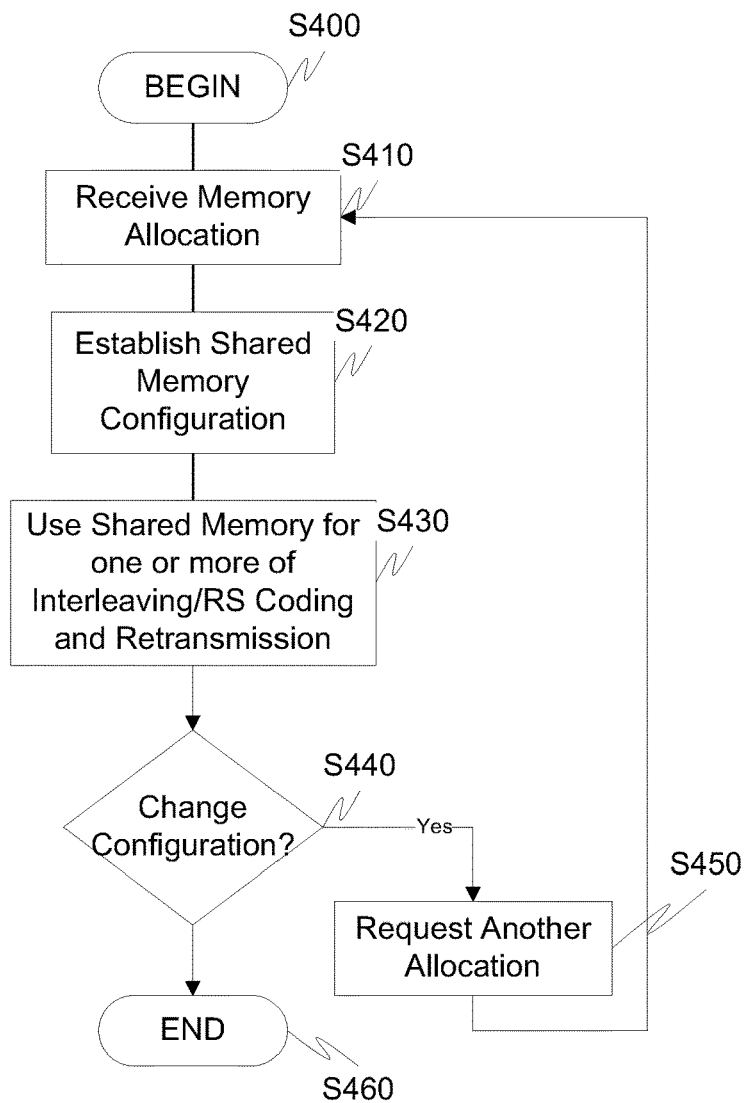
FIG. 5 is a flowchart outlining an exemplary method for memory sharing according this invention.

FIG. 5 illustrates an exemplary memory sharing methodology for use with a retransmission function and one or more of interleaving/deinterleaving functionality, RS coding/decoding functionality. In particular, control begins in step S400 and continues to step S410. In step S410, the memory allocation is received from, for example, a memory management module that may be located in the same transceiver, or at a remote transceiver. Next, in step S420, the memory sharing configuration is established and then, in step S430, the memory is shared between a retransmission function and one or more of the interleaving/deinterleaving functionality, RS coding/decoding functionality. Control then continues to step S440.

In step S440, a determination is made whether the memory sharing configuration should be changed. For example, the memory sharing configuration can be dynamically changed based on changes in the communication channel or data type(s) being sent on the communication channel. More specifically, for example, if the communications channel was not performing well, e.g., an increase in bit errors, it may be advantageous to increase the retransmission capability while decreasing the FEC/interleaving capability or vise-versa, which could have an impact on how the memory sharing should be configured.

If the memory sharing configuration should be changed, control continues to step S450 where another allocation can be requested, with control continuing back to step S410. Otherwise, control continues to step S460 where the control sequence ends.

While the above-described flowcharts have been discussed in relation to a particular sequence of events, it should be appreciated that changes to this sequence can occur without materially effecting the operation of the invention. Additionally, the exact sequence of events need not occur as set forth in the exemplary embodiments, but rather the steps can be performed by one or the other transceiver in the communication system provided both transceivers are aware of the technique being used for initialization. Additionally, the exemplary techniques illustrated herein are not limited to the specifically illustrated embodiments but can also be utilized with the other exemplary embodiments and each described feature is individually and separately claimable.

The above-described system can be implemented on wired and/or wireless telecommunications devices, such a modem, a multicarrier modem, a DSL modem, an ADSL modem, an xDSL modem, a VDSL modem, a linecard, test equipment, a multicarrier transceiver, a wired and/or wireless wide/local area network system, a satellite communication system, network-based communication systems, such as an IP, Ethernet or ATM system, a modem equipped with diagnostic capabilities, or the like, or on a separate programmed general purpose computer having a communications device or in conjunction with any of the following communications protocols: CDSL, ADSL2, ADSL2+, VDSL1, VDSL2, HDSL, DSL Lite, IDSL, RADSL, SDSL, UDSL or the like.

Additionally, the systems, methods and protocols of this invention can be implemented on a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device such as PLD, PLA, FPGA, PAL, a modem, a transmitter/receiver, any comparable means, or the like. In general, any device capable of implementing a state machine that is in turn capable of implementing the methodology illustrated herein can be used to implement the various communication methods, protocols and techniques according to this invention.

Furthermore, the disclosed methods may be readily implemented in software using object or object-oriented software development environments that provide portable source code that can be used on a variety of computer or workstation platforms. Alternatively, the disclosed system may be implemented partially or fully in hardware using standard logic circuits or VLSI design. Whether software or hardware is used to implement the systems in accordance with this invention is dependent on the speed and/or efficiency requirements of the system, the particular function, and the particular software or hardware systems or microprocessor or microcomputer systems being utilized. The communication systems, methods and protocols illustrated herein can be readily implemented in hardware and/or software using any known or later developed systems or structures, devices and/or software by those of ordinary skill in the applicable art from the functional description provided herein and with a general basic knowledge of the computer and telecommunications arts.

Moreover, the disclosed methods may be readily implemented in software that can be stored on a storage medium, executed on programmed general-purpose computer with the cooperation of a controller and memory, a special purpose computer, a microprocessor, or the like. In these instances, the systems and methods of this invention can be implemented as program embedded on personal computer such as an applet, JAVA® or CGI script, as a resource residing on a server or computer workstation, as a routine embedded in a dedicated communication system or system component, or the like. The system can also be implemented by physically incorporating the system and/or method into a software and/or hardware system, such as the hardware and software systems of a communications transceiver.

It is therefore apparent that there has been provided, in accordance with the present invention, systems and methods for packet retransmission and memory sharing. While this invention has been described in conjunction with a number of embodiments, it is evident that many alternatives, modifications and variations would be or are apparent to those of ordinary skill in the applicable arts. Accordingly, it is intended to embrace all such alternatives, modifications, equivalents and variations that are within the spirit and scope of this invention.

The invention claimed is:

1. An apparatus comprising:
 a multicarrier transceiver including a processor and memory capable of:
 transmitting a packet using forward error correction encoding and interleaving, wherein the packet comprises a header field and a plurality of Reed-Solomon codewords, and wherein the header field comprises a sequence identifier (SID); and
 receiving a message using forward error correction decoding and without using deinterleaving, wherein the message is received in a single DMT symbol, and wherein the message includes an acknowledgement (ACK) or a negative acknowledgement (NACK) of the transmitted packet.

2. The apparatus of claim 1, wherein the received message has a higher immunity to noise than the transmitted packet.

3. The apparatus of claim 1, wherein the transceiver is capable of retransmitting the packet using forward error correction encoding and interleaving.

4. The apparatus of claim 1, wherein a physical layer of the transceiver is capable of generating the packet and the message.

5. The apparatus of claim 1, wherein a layer above a physical layer of the transceiver is capable of generating the packet and the message.

6. The apparatus of claim 2, wherein a physical layer of the transceiver is capable of generating the packet and the message.

7. The apparatus of claim 2, a layer above a physical layer of the transceiver is capable of generating the packet and the message.

8. An apparatus comprising:
 a multicarrier transceiver including a processor and memory capable of:
 receiving a packet using forward error correction decoding and deinterleaving, wherein the packet comprises a header field and a plurality of Reed-Solomon codewords, and wherein the header field comprises a sequence identifier (SID); and
 transmitting a message using forward error correction encoding and without using interleaving, wherein the message is transmitted in a single DMT symbol and wherein the message includes an acknowledgement (ACK) or a negative acknowledgement (NACK) of the received packet.

9. The apparatus of claim 8, wherein the transmitted message has a higher immunity to noise than the received packet.

10. The apparatus of claim 8, wherein the transceiver is capable of receiving a retransmitted packet using forward error correction decoding and deinterleaving.

11. The apparatus of claim 8, wherein a physical layer of the transceiver is capable of generating the packet and the message.

12. The apparatus of claim 8, wherein a layer above a physical layer of the transceiver is capable of generating the packet and the message.

13. The apparatus of claim 9, wherein a physical layer of the transceiver is capable of generating the packet and the message.

14. The apparatus of claim 9, wherein a layer above a physical layer of the transceiver is capable of generating the packet and the message.

15. A non-transitory computer-readable information storage media having stored thereon instructions, that when executed by one or more processors in a transceiver, cause the transceiver to:
   transmit a packet using forward error correction encoding and interleaving, wherein the packet comprises a header field and a plurality of Reed-Solomon codewords, and wherein the header field comprises a sequence identifier (SID); and
   receive a message using forward error correction decoding and without using deinterleaving, wherein the message is received in a single DMT symbol, and wherein the message includes an acknowledgement (ACK) or a negative acknowledgement (NACK) of the transmitted packet.

16. The media of claim 15, wherein the received message has a higher immunity to noise than the transmitted packet.

17. The media of claim 15, wherein instructions further cause the transceiver to retransmit the packet using forward error correction encoding and interleaving.

18. The media of claim 15, wherein instructions further cause a physical layer of the transceiver to generate the packet and the message.

19. The media of claim 15, wherein instructions further cause a layer above a physical layer of the transceiver to generate the packet and the message.

20. The media of claim 16, wherein instructions further cause a physical layer of the transceiver to generate the packet and the message.

21. The media of claim 16, wherein instructions further cause a layer above a physical layer of the transceiver to generate the packet and the message.

22. A non-transitory computer-readable information storage media having stored thereon instructions, that when executed by one or more processors in a transceiver, cause the transceiver to:
   receive a packet using forward error correction decoding and deinterleaving, wherein the packet comprises a header field and a plurality of Reed-Solomon codewords, and wherein the header field comprises a sequence identifier (SID); and
   transmit a message using forward error correction encoding and without using interleaving, wherein the message is transmitted in a single DMT symbol and wherein the message includes an acknowledgement (ACK) or a negative acknowledgement (NACK) of the received packet.

23. The media of claim 22, wherein the transmitted message has a higher immunity to noise than the received packet.

24. The media of claim 22, wherein the instructions further cause the transceiver to retransmit the packet using forward error correction decoding and deinterleaving.

25. The media of claim 22, wherein instructions further cause a physical layer of the transceiver to generate the packet and the message.

26. The media of claim 22, wherein instructions further cause a layer above a physical layer of the transceiver to generate the packet and the message.

27. The media of claim 23, wherein instructions further cause a physical layer of the transceiver to generate the packet and the message.

28. The media of claim 23, wherein instructions further cause a layer above a physical layer of the transceiver to generate the packet and the message.

* * * * *

(12) INTER PARTES REVIEW CERTIFICATE (3437th)

United States Patent
Tzannes

(10) Number: US 10,833,809 K1
(45) Certificate Issued: Feb. 8, 2024

(54) TECHNIQUES FOR PACKET AND MESSAGE COMMUNICATION IN A MULTICARRIER TRANSCEIVER ENVIRONMENT

(71) Applicant: Marcos C. Tzannes

(72) Inventor: Marcos C. Tzannes

Trial Number:

IPR2022-01012 filed May 20, 2022

Inter Partes Review Certificate for:

Patent No.: 10,833,809
Issued: Nov. 10, 2020
Appl. No.: 16/701,343
Filed: Dec. 3, 2019

The results of IPR2022-01012 are reflected in this inter partes review certificate under 35 U.S.C. 318(b).

INTER PARTES REVIEW CERTIFICATE
U.S. Patent 10,833,809 K1
Trial No. IPR2022-01012
Certificate Issued Feb. 8, 2024

AS A RESULT OF THE INTER PARTES REVIEW PROCEEDING, IT HAS BEEN DETERMINED THAT:

Claims 1-28 are found patentable.

\* \* \* \* \*